(12) United States Patent
Senesac

(10) Patent No.: US 9,182,892 B2
(45) Date of Patent: *Nov. 10, 2015

(54) CONDITION OF ASSEMBLY VISUALIZATION SYSTEM

(71) Applicant: The Boeing Company, Chicago, IL (US)

(72) Inventor: Christopher J. Senesac, Daniel Island, SC (US)

(73) Assignee: THE BOEING COMPANY, Chicago, IL (US)

( * ) Notice: Subject to any disclaimer, the term of this patent is extended or adjusted under 35 U.S.C. 154(b) by 199 days.

This patent is subject to a terminal disclaimer.

(21) Appl. No.: 13/834,893

(22) Filed: Mar. 15, 2013

(65) Prior Publication Data

US 2014/0282183 A1 Sep. 18, 2014

(51) Int. Cl.
| | |
|---|---|
| *G06F 3/0484* | (2013.01) |
| *G06F 17/50* | (2006.01) |
| *G06T 19/00* | (2011.01) |
| *B64F 5/00* | (2006.01) |

(52) U.S. Cl.
CPC ............ *G06F 3/0484* (2013.01); *B64F 5/0009* (2013.01); *B64F 5/00* (2013.01); *G06F 17/50* (2013.01); *G06T 19/00* (2013.01)

(58) Field of Classification Search
CPC ....... G06F 3/0484; G06F 17/50; G06T 19/00; B64F 5/00; B64F 5/0009
See application file for complete search history.

(56) References Cited

U.S. PATENT DOCUMENTS

| | | | |
|---|---|---|---|
| 5,771,043 A | 6/1998 | Nigawara et al. |
| 5,822,218 A | 10/1998 | Moosa et al. |
| 6,240,328 B1 | 5/2001 | LaLonde et al. |
| 6,477,471 B1 | 11/2002 | Hedstrom et al. |
| 6,487,479 B1 | 11/2002 | Nelson |
| 7,302,443 B2 | 11/2007 | Nakajima et al. |
| 7,333,991 B2 | 2/2008 | Hill et al. |
| 7,353,192 B1 | 4/2008 | Ellis et al. |
| 7,365,747 B2 | 4/2008 | Finlayson et al. |
| 7,366,688 B2 | 4/2008 | Kwasniewski et al. |
| 7,646,384 B2 | 1/2010 | Anderson et al. |
| 8,027,745 B1 | 9/2011 | Freeze |
| 8,352,904 B2 | 1/2013 | Hodges |
| 8,571,951 B2 | 10/2013 | Diana et al. |
| 8,620,627 B2 | 12/2013 | Nakhle et al. |

(Continued)

FOREIGN PATENT DOCUMENTS

| | | |
|---|---|---|
| EP | 1321869 A2 | 6/2003 |
| EP | 2431915 A2 | 3/2012 |

(Continued)

OTHER PUBLICATIONS

International Search Report and Written Opinion, dated Apr. 25, 2014, regarding Application No. PCT/US2014/010912, 10 pages.

(Continued)

*Primary Examiner* — Ting Lee
(74) *Attorney, Agent, or Firm* — Yee & Associates, P.C.

(57) ABSTRACT

A method and apparatus for identifying a condition of assembly. A model for an aircraft is identified. A state from states of assembly for the aircraft is identified. Parts present in the aircraft for the state selected for the aircraft are identified. Sections of the aircraft with the parts present in the aircraft are displayed for the state selected in a graphical user interface on a display device.

16 Claims, 14 Drawing Sheets

(56) References Cited

U.S. PATENT DOCUMENTS

| | | |
|---|---|---|
| 8,914,149 B2 | 12/2014 | Safa-Bakhsh et al. |
| 2002/0007225 A1 | 1/2002 | Costello et al. |
| 2003/0055812 A1 | 3/2003 | Williams et al. |
| 2003/0120472 A1 | 6/2003 | Lind |
| 2003/0158702 A1 | 8/2003 | Busche et al. |
| 2004/0098151 A1* | 5/2004 | Carlucci et al. ............ 700/95 |
| 2005/0278062 A1 | 12/2005 | Janert et al. |
| 2006/0106682 A1 | 5/2006 | Van Dyck et al. |
| 2006/0119601 A1 | 6/2006 | Finlayson et al. |
| 2008/0140270 A1 | 6/2008 | Davis et al. |
| 2008/0187897 A1 | 8/2008 | Franzen et al. |
| 2008/0234850 A1 | 9/2008 | Bowling et al. |
| 2008/0294395 A1 | 11/2008 | Lu |
| 2008/0301012 A1 | 12/2008 | Cogswell et al. |
| 2009/0013281 A1 | 1/2009 | Helman et al. |
| 2009/0138230 A1 | 5/2009 | Davies et al. |
| 2009/0312897 A1 | 12/2009 | Jamrosz et al. |
| 2010/0010794 A1 | 1/2010 | Sweers |
| 2010/0125468 A1 | 5/2010 | Avery et al. |
| 2010/0161095 A1 | 6/2010 | Lindgren |
| 2010/0175013 A1 | 7/2010 | Krauter et al. |
| 2011/0022208 A1 | 1/2011 | Bouffiou et al. |
| 2011/0046763 A1 | 2/2011 | Tsuchiya et al. |
| 2011/0087466 A1 | 4/2011 | Vossmann |
| 2011/0087513 A1 | 4/2011 | Floyd et al. |
| 2011/0137443 A1 | 6/2011 | Farahani |
| 2011/0169924 A1 | 7/2011 | Haisty et al. |
| 2011/0172795 A1 | 7/2011 | Hansen et al. |
| 2011/0288840 A1 | 11/2011 | Kropinski et al. |
| 2012/0071998 A1 | 3/2012 | Davies et al. |
| 2012/0075343 A1 | 3/2012 | Chen et al. |
| 2012/0100520 A1 | 4/2012 | Jo et al. |
| 2012/0130521 A1 | 5/2012 | Kohlhoff |
| 2012/0249588 A1 | 10/2012 | Tison et al. |
| 2012/0303336 A1 | 11/2012 | Becker et al. |
| 2012/0306666 A1 | 12/2012 | Xu et al. |
| 2013/0006409 A1 | 1/2013 | Evans et al. |
| 2013/0124150 A1 | 5/2013 | Kim et al. |
| 2013/0132373 A1 | 5/2013 | Huang et al. |

FOREIGN PATENT DOCUMENTS

| | | |
|---|---|---|
| EP | 2458562 A1 | 5/2012 |
| EP | 2790136 A1 | 10/2014 |
| WO | WO0049544 A2 | 8/2000 |
| WO | WO2012166545 A2 | 12/2012 |
| WO | WO2013078156 A1 | 5/2013 |
| WO | WO2013078265 A1 | 5/2013 |

OTHER PUBLICATIONS

Extended European Search Report, dated Jun. 2, 2014, regarding Application No. 14160787.9, 6 pages.

"Notice from the European Patent Office dated Oct. 1, 2007 concerning business methods," Official Journal EPO, Nov. 2007, pp. 592-593.

Senesac, "Serial Number Control Visualization System," U.S. Appl. No. 14/467,706, filed Aug. 25, 2014, 113.

Extended European Search Report, dated Jul. 17, 2014, regarding Application No. 14162481.7, 5 pages.

Extended European Search Report, dated Jul. 23, 2014, regarding Application No. 14157597.7, 7 pages.

Extended European Search Report, dated Aug. 22, 2014, regarding Application No. EP14159832.6, 9 pages.

Extended European Search Report, dated Sep. 30, 2014, regarding Application No. EP14159760.9, 6 pages.

International Search Report and Written Opinion, dated Nov. 19, 2014, regarding Application No. PCT/US2014/011196, 10 pages.

International Search Report and Written Opinion, dated Dec. 1, 2014, regarding Application No. PCT/US2014/031030, 9 pages.

Extended European Search Report, dated Dec. 3, 2014, regarding Application No. 14170988.1, 7 pages.

Office Action, dated Dec. 17, 2014, regarding U.S. Appl. No. 131780,109, 37 pages.

Gass et al., "Locator System for Three-Dimensional Visualization," U.S. Appl. No. 13/855,102, filed Apr. 2, 2013, 87 pages.

Senesac et al., "Condition of Assembly Visualization System Based on Build Cycles," U.S. Appl. No. 13/835,262, filed Mar. 15, 2013, 79 pages.

Senesac et al., "Shop Order Status Visualization System," U.S. Appl. No. 13/785,616, filed Mar. 5, 2013, 98 pages.

Senesac, "Nonconformance Visualization System," U.S. Appl. No. 13/798,964, filed Mar. 13, 2013, 84 pages.

Senesac, "Object Visualization System," U.S. Appl. No. 13/780,109, filed Feb. 28, 2013, 61 pages.

Senesac, "Shop Order Status Visualization System," U.S. Appl. No. 13/858,364, filed Apr. 8, 2013, 108 pages.

Senesac et al., "Aircraft Comparison System," U.S. Appl. No. 13/860,126, filed Apr. 10, 2013, 103 pages.

Senesac et al., "Nonconformance Visualization System," U.S. Appl. No. 13/861,678, filed Apr. 12, 2013, 116 pages.

Senesac, "Shop Order Status Visualization System," U.S. Appl. No. 13/890,347, filed May 9, 2013, 96 pages.

Prazak et al., "Visualization of an Object Using a Visual Query System," U.S. Appl. No. 13/852,063, filed Mar. 28, 2013, 50 pages.

Senesac et al., "Aircraft Comparison System with Synchronized Displays," U.S. Appl. No. 13/922,411, filed Jun. 20, 2013, 120 pages.

Final Office Action, dated Mar. 27, 2015, regarding U.S. Appl. No. 13/780,109, 18 pages.

Non-Patent Literature including images from the website www.aso.com, as published on Jan. 16, 2013 based on captures in the Internet Archives tool referred to as the WayBackMachine, http://web.archive.org/web/20130116040904/http://www.aso.com/ ("NPL 1"), as in Final Office Action dated Mar. 27, 2015, 3 pages.

"Marianna Airmotive Uses a FARO Laser Tracker to Reduce Repair Turnaround Time dramatically," Mar. 7, 2015, 2 pages. http://www.mariannaairmotive.com.

"What's New in SolidWorks," SolidWorks, Version 2010, 199 pages. http://files.solidworks.com/Supportfiles/Whats_new/2010/English/whatsnew.pdf.

Office Action, dated Feb. 26, 2015, regarding U.S. Appl. No. 13/858,364, 32 pages.

Notice of Allowance, dated Apr. 13, 2015, regarding U.S. Appl. No. 13/858,364, 5 pages.

Office Action, dated May 6, 2015, regarding U.S. Appl. No. 13/852,063, 39 pages.

Office Action, dated Mar. 4, 2015, regarding U.S. Appl. No. 13/855,102, 28 pages.

Office Action, dated Apr. 23, 2015, regarding U.S. Appl. No. 13/798,964, 39 pages.

Office Action, dated May 5, 2015, regarding U.S. Appl. No. 13/861,678, 48 pages.

Australian Government Patent Examination Report No. 1, dated Mar. 18, 2015, regarding Application No. 2014200514, 4 pages.

Canadian Intellectual Property Office Examination Search Report, dated Mar. 24, 2015, regarding Application No. 2,840,798, 6 pages.

Australian Government Patent Examination Report No. 1, dated Mar. 27, 2015, regarding Application No. 2014200292, 3 pages.

Canadian Intellectual Property Office Examination Search Report, dated Apr. 15, 2015, regarding Application No. 2,839,913, 4 pages.

Final Office Action, dated Jun. 26, 2015, regarding U.S. Appl. No. 13/855,102, 18 pages.

Office Action, dated Jun. 29 2015, regarding U.S. Appl. No. 13/922,411, 43 pages.

Australian Government Patent Examination Report No. 2, dated Jul. 8, 2015, regarding Application No. 2014200514, 3 pages.

Australian Government Patent Examination Report No. 3, dated Aug. 13, 2015, regarding Application No. 2014200514, 4 pages.

Australian Government Patent Examination Report No. 2, dated Jul. 30, 2015, regarding Application No. 2014200292, 5 pages.

International Preliminary Report on Patentability, dated Sep. 1, 2015, regarding Application No. PCT/US2014/010912, 6 pages.

* cited by examiner

CONDITION OF ASSEMBLY VISUALIZATION SYSTEM

CROSS-REFERENCE TO RELATED APPLICATIONS

This application is related to the following patent applications: entitled "Object Visualization System," Ser. No. 13/780,109, filed Feb. 28, 2013, "Shop Order Status Visualization System," Ser. No. 13/785,616, filed Mar. 5, 2013, "Nonconformance Visualization System," Ser. No. 13/798,964, filed Mar. 13, 2013, "Condition of Assembly Visualization System," Ser. No. 13/834,893, filed Mar. 15, 2013, "Condition of Assembly Visualization System Based on Build Cycles," Ser. No. 13/835,262, filed Mar. 15, 2013, "Locator System for Three-Dimensional Visualization," Ser. No. 13/855,102, filed Apr. 2, 2013, "Shop Order Status Visualization System," Ser. No. 13/858,364, filed Apr. 8, 2013, "Aircraft Comparison System," Ser. No. 13/860,126, filed Apr. 10, 2013, "Nonconformance Visualization System," Ser. No. 13/861,678, filed Apr. 12, 2013, "Shop Order Status Visualization System," Ser. No. 13/890,347, filed May 9, 2013, and "Aircraft Comparison System with Synchronized Displays," Ser. No. 13/922,411, each assigned to the same assignee, and each incorporated herein by reference.

BACKGROUND INFORMATION

1. Field

The present disclosure relates generally to manufacturing and, in particular, to manufacturing vehicles. Still more particularly, the present disclosure relates to a method and apparatus for assembling vehicles in a manufacturing environment.

2. Background

The assembly of an aircraft is an extremely complex process. Hundreds of thousands of parts may be assembled for an aircraft.

The assembly of an aircraft may involve manufacturing different parts of aircraft in geographically diverse locations. These different parts may then be finally assembled in a single location. For example, different portions of a fuselage of the composite aircraft may be assembled in different locations and flown to a central location where the final assembly line is located. Additionally, other parts such as engines, auxiliary power units, seats, computer systems, line replaceable units, or other components in aircraft may be shipped to this final location for assembly to form the assembled aircraft.

The assembly of the different parts involves assigning tasks to different operators. The assignment of these tasks may take the form of shop order instances. Each shop order instance may include instructions and an identification of parts for a particular assembly in the aircraft.

Shop floor operators may have a need to identify locations of parts on the aircraft in order to follow assembly instructions described in shop order instances. These locations are ones relative to the particular aircraft being assembled. Currently, operators assigned a task to assemble a part for the aircraft may look at paper copies of the parts of aircraft to determine where to perform tasks to install or assemble parts for the aircraft. These paper copies may provide some guidance to an operator, but often times they may be difficult to understand and may not include sufficient information.

In some cases, the operator may view a computer-aided design model of the aircraft using a computer-aided design software system. These types of systems, however, require training and experience to maneuver through the model of the aircraft.

For example, an operator of the computer-aided design software system often uses aircraft coordinates to identify locations in the aircraft. Aircraft coordinates have an origin relative to some location in the aircraft. Further, when traversing through the model, locations are identified using aircraft coordinates. These aircraft coordinates, however, are not helpful to an operator that is assigned a task in a shop order instance. The aircraft coordinates may need to be translated into action locations for the operator. Additionally, the model does not provide the operator an idea of what parts may or may not be already installed in the aircraft for performing a particular task.

As a result, operators may take more time than needed, may need additional training, or both to view locations in the aircraft where tasks in a shop order instance are to be performed. This additional time or training may increase the time or expense needed to assemble an aircraft.

Therefore, it would be desirable to have a method and apparatus that takes into account at least some of the issues discussed above, as well as other possible issues.

SUMMARY

In one illustrative embodiment, a method for identifying a condition of assembly is present. A model for an aircraft is identified. A state from states of assembly is identified for the aircraft. Parts present in the aircraft are identified for the state selected for the aircraft. Sections of the aircraft with the parts present in the aircraft are displayed for the state selected in a graphical user interface on a display device.

In another illustrative embodiment, another method for identifying a condition of assembly is present. A model is identified for an object. A state from states of assembly for the object is identified. Parts present in an aircraft are identified for the state selected for the object. The parts present in the aircraft for the state selected in the graphical user interface are displayed on a display device.

In yet another illustrative embodiment, an apparatus comprises an object manager configured to identify a model for an aircraft. A state is identified from a plurality of states of assembly for the aircraft. Parts present in the aircraft are identified for the state selected for the aircraft. Sections of the aircraft are displayed with the parts present in the aircraft for the state selected. Information for operating manufacturing equipment to manufacture the aircraft is generated.

In yet another illustrative embodiment, an aircraft manufacturing system comprises a control system and an object manager in the control system. The control system is configured to control operation of manufacturing equipment. The object manager is configured to identify a model for the aircraft. The object manager is further configured to identify a state from a plurality of states of assembly for the aircraft. The object manager is still further configured to identify parts present in the aircraft for the state selected for the aircraft. The object manager is further configured to display sections of the aircraft with the parts present in the aircraft for the state selected. The object manager is still further configured to generate information for operating the manufacturing equipment to manufacture the aircraft.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that in performing tasks in shop order instances, information such as what parts are currently present in the aircraft may be useful in planning or performing tasks to install parts.

The illustrative embodiments recognize and take into account that knowing what parts should be present for a particular state in the assembly of an aircraft may be desirable in performing tasks to assemble an aircraft. This knowledge may also be useful for planning or managing the performance of tasks. The performance of tasks includes planning operations to install parts, installing parts, inspecting installed parts, or some combination thereof.

Thus, the illustrative embodiments provide a method and apparatus for identifying a condition of assembly for an object such as an aircraft. A model of an aircraft is identified. A state from states of assembly for the aircraft is identified. The parts present in the aircraft are identified for the state selected for the aircraft. Sections of the aircraft with the parts present in the aircraft are displayed for the state selected in a graphical user interface on a display device.

Figure 1:
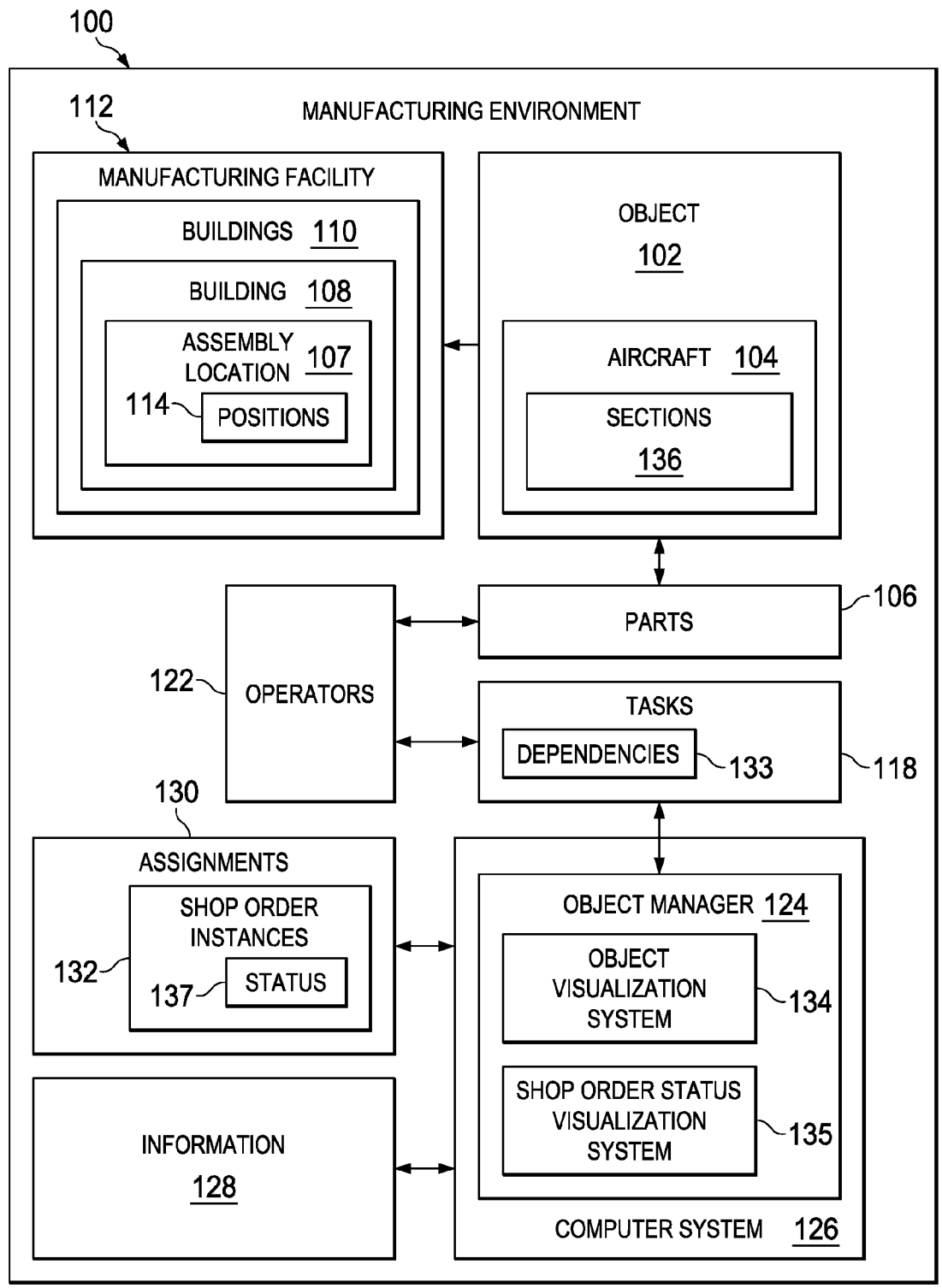
FIG. 1 is an illustration of a block diagram of a manufacturing environment in accordance with an illustrative embodiment.

With reference now to the figures, and in particular, with reference to FIG. 1, an illustration of a block diagram of a manufacturing environment is depicted in accordance with an illustrative embodiment. Manufacturing environment 100 is an example of an environment in which object 102 may be assembled.

In this illustrative example, object 102 takes the form of aircraft 104. Object 102 is completed by assembling parts 106. A part is a group of components. As used herein, a "group of," when used with reference items, means one or more items. For example, a group of components is one or more components.

A part may be a single component or assembly of components in these depicted examples. For example, the part may be a seat, a row of seats, an in-flight entertainment system, a duct, a system of ducts, a global positioning system receiver, an engine, an engine housing, an inlet, or other suitable types of parts.

In this illustrative example, assembling parts 106 may take place in assembly location 107 in building 108 of buildings 110 at manufacturing facility 112. The assembly of parts 106 in building 108 may occur in positions 114 in assembly location 107 for object 102. Each position in positions 114 is a location in building 108 in which a group of tasks 118 is performed to assemble object 102.

In these illustrative examples, a task is a piece of work. A task may be comprised of one or more operations that are performed by a group of operators 122 assigned to work on the assembly of object 102.

In the illustrative examples, object manager 124 may be used to manage the assembly of object 102. When object 102 is aircraft 104, object manager 124 may be part of an aircraft management system. Object manager 124 may be implemented in software, hardware, firmware or a combination thereof. When software is used, the operations performed by object manager 124 may be implemented in program code configured to run on a processor unit. When firmware is used, the operations performed by object manager 124 may be implemented in program code and data and stored in persistent memory to run on a processor unit. When hardware is employed, the hardware may include circuits that operate to perform the operations in object manager 124.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, or other suitable hardware devices. Additionally, the processes may be implemented in organic components integrated with inorganic components and/or may be comprised entirely of organic components excluding a human being. For example, the processes may be implemented as circuits in organic semiconductors.

As depicted, object manager 124 may be implemented in computer system 126. Computer system 126 is one or more computers. When more than one computer is present, the computers in computer system 126 may communicate with each other using a communications medium such as a network. Computer system 126 may be located all in the same location or in different geographic locations. For example, computer system 126 may be distributed through buildings 110 or located in building 108. Portions of computer system 126 may even be located in another geographic location separate from manufacturing facility 112.

In managing the assembly of object 102, object manager 124 may manage tasks 118 and information 128 about object 102.

In the illustrative example, the management of tasks 118 may include at least one of assigning tasks 118 to operators 122, monitoring the status of tasks 118, organizing tasks 118, providing information about tasks 118, or other suitable operations. Information 128 may include, for example, the models of objects, part inventories, or other suitable information relating to object 102.

As used herein, the phrase "at least one of," when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C. The item may be a particular object, thing, or a category. In other words, at least one of means any combination of items and number of items may be used from the list but not all of the items in the list are required.

In these illustrative examples, object manager 124 may manage tasks 118 using assignments 130 in the form of shop order instances 132 based upon the aircraft program definitions. For example, object manager 124 may assign tasks through the use of shop order instances 132 to operators 122 for performance and assembling of object 102. Additionally, the status of shop order instances 132 may be used to identify the state of assembly of object 102 by operators 122.

Additionally, tasks 118 may have dependencies 133. In other words, tasks 118 may be performed in a particular order. Dependencies 133 may dictate when tasks within tasks 118 should be performed relative to other tasks in tasks 118. Dependencies 133 may also be for parts 106 in addition to or in place of tasks 118. In this form, dependencies 133 may result in dependencies 133 for tasks 118.

As a result, dependencies 133 may affect the manner in which assignments 130 are made as shop order instances 132. In particular, dependencies 133 may be used to determine when shop order instances 132 should be performed.

In these illustrative examples, object manager 124 may provide different functions and capabilities for assembling object 102. For example, object manager 124 may include at least one of object visualization system 134, shop order status visualization system 135, or other types of systems. The systems may be implemented using hardware, software, or some combination thereof.

In one illustrative example, object visualization system 134 may provide a visualization of object 102 to operators 122. In particular, operators 122 may perform queries using object visualization system 134 to view a number of sections 136 in object 102. In particular, sections 136 may be sections that correspond to sections at manufacturing facility 112 for assembly of object 102, such as aircraft 104.

Additionally, object visualization system 134 may provide a visualization of parts 106 in aircraft 104 during different times or positions in positions 114. In other words, parts 106 may be present at different times or positions in positions 114. Object visualization system 134 provides operators 122 an ability to visualize these different conditions of assembly for aircraft 104 as well as other types of objects. In other words, object visualization system 134 may operate as a condition of assembly visualization system. In these illustrative examples, the manufacturing may include at least one of fabricating components for parts, assembling components to form parts, assembling parts for object 102, or some other suitable manufacturing operation performed to assemble object 102. For example, object manager 124 may provide visual information about all of object 102 or one or more specific sections of object 102. This type of visualization may be especially useful when object 102 takes the form of aircraft 104. Information 128 may be used when operators 122 perform tasks 118 with respect to parts 106 to assemble aircraft 104.

In another illustrative example, shop order status visualization system 135 may provide a visualization of status 137 of shop order instances 132. This information may be provided visually to operators 122. In particular, object manager 124 may function as shop order status visualization system 135 as well as provide other suitable functions in managing the assembly of object 102.

Figure 2:
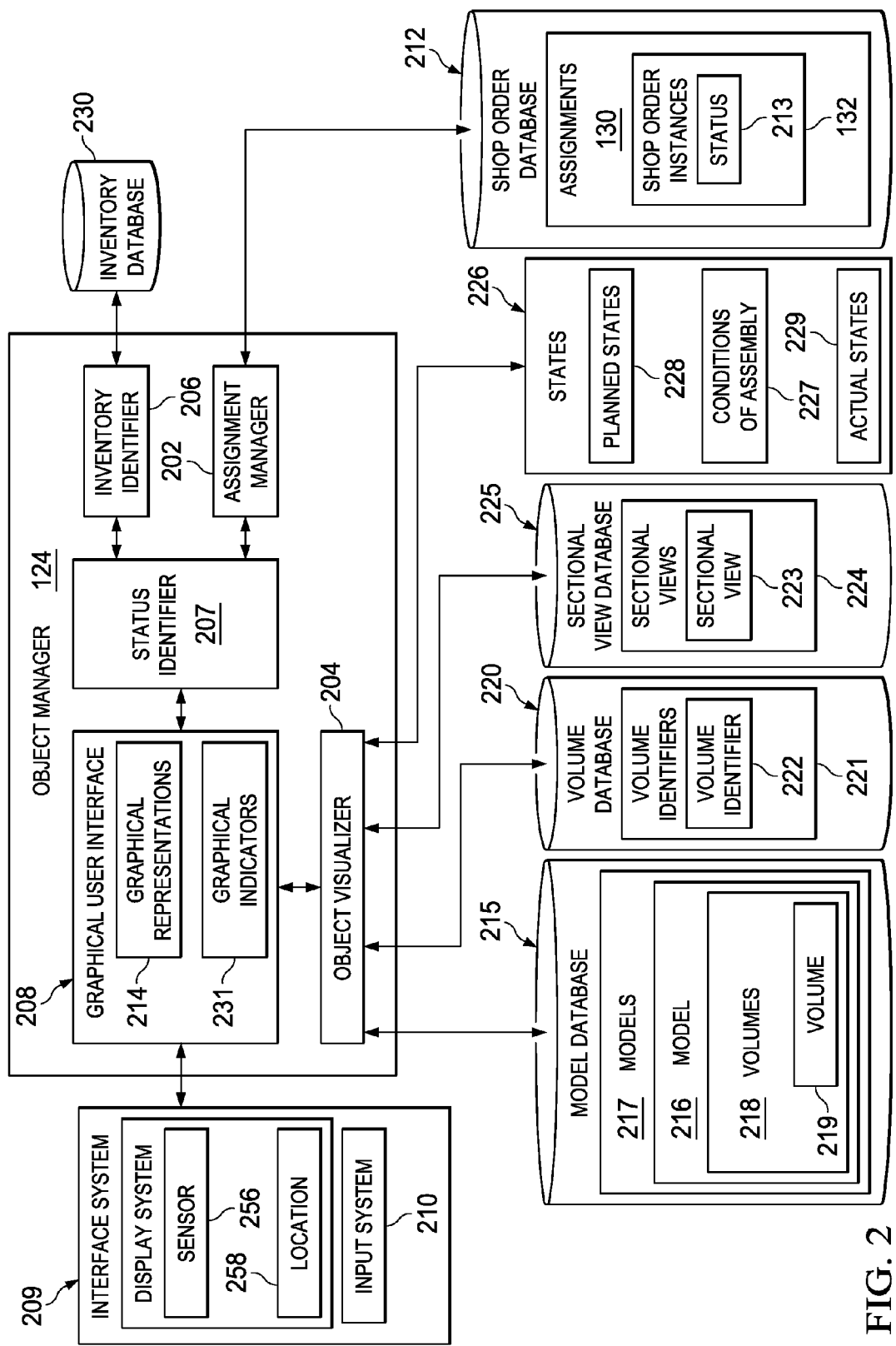
FIG. 2 is an illustration of a block diagram of an object manager in accordance with an illustrative embodiment.

Turning now to FIG. 2, an illustration of a block diagram of an object manager is depicted in accordance with an illustrative embodiment. Examples of components that may be implemented in object manager 124 in FIG. 1 are shown in this figure.

As depicted, object manager 124 includes a number of different components. For example, object manager 124 includes assignment manager 202, object visualizer 204, inventory identifier 206, status identifier 207, and graphical user interface 208. These different components along with object manager 124 may be implemented using hardware, software, or some combination thereof.

Graphical user interface 208 is configured to provide an interface for operators 122 in FIG. 1 to interact with object manager 124. In these illustrative examples, graphical user interface 208 may be displayed on display system 209 in interface system 210. Display system 209 is hardware and may include one or more display devices selected from at least one of a liquid crystal display (LCD), a light emitting display (LED), an organic light emitting display (OLED), or other suitable types of display devices.

Input may be received from operators 122 through input system 211 in interface system 210. Input system 211 is a hardware system. Input system 211 may include one or more devices. These devices may include at least one of a keyboard, a mouse, a joystick, a touchscreen panel, or other suitable types of devices.

In this illustrative example, assignment manager 202 is configured to manage assignments 130 in the form of shop order instances 132 in shop order database 212. For example, assignment manager 202 may be used to assign tasks 118 in FIG. 1 to operators 122 using shop order instances 132. Additionally, assignment manager 202 also may be configured to receive information about the performance of tasks 118 assigned through shop order instances 132. This information may be used by assignment manager 202 to generate and update status 213 for shop order instances 132.

Object visualizer 204 is configured to generate graphical representations 214 for parts 106 in FIG. 1. Graphical representations 214 may be displayed on graphical user interface 208 in display system 209. As depicted, object visualizer 204 is configured to access model database 215. Object visualizer 204 may identify model 216 from models 217 in model database 215 for object 102 in FIG. 1 and, in particular, for aircraft 104 in FIG. 1. Model 216 is used to generate graphical representations 214 in the illustrative example.

In these illustrative examples, graphical representations 214 may be generated for sections 136 of object 102 in FIG. 1, which may take the form of aircraft 104. In this illustrative example, model 216 may be identified for object 102 from models 217 in model database 215. Models 217 may take various forms. For example, without limitation, models 217 may include computer-aided design (CAD) files.

Each model in models 217 may be for a particular object. The objects may be of the same type but for different shop order instances. For example, if models 217 are for a particular type of aircraft, each model may be for a particular aircraft that is being assembled for a customer. The different models may be for the same aircraft model but may have variations for different options selected by a customer. In other illustrative examples, models 217 may include models for different types of aircraft 104.

The generation of graphical representations 214 may be based on all of model 216 or a group of volumes 218 in model 216. These items may have different shapes. For example, volume 219 in volumes 218 may be a cube, a cuboid, a cylinder, a sphere, or some other suitable shape.

In these illustrative examples, volume 219 is for at least a portion of a part in parts 106 of object 102. Volume 219 may be large enough to encompass the part. Volume 219 may also be larger than the part. In these illustrative examples, volume 219 may comprise an amount of space around the part for viewing the part in a graphical user interface. For example, the amount of space around the part may be for viewing the part in the graphical user interface from one or more angles. In this example, the one or more angles may be one or more angles from the point of view of an operator. In this example, the point of view of the operator may be of an operator performing a task associated with the part.

As depicted, volumes 218 may be identified in model 216 using volume database 220. Volume database 220 is a collection of information that may be used to identify which volumes in volumes 218 may be displayed as graphical representations 214. In particular, the collection of information may include volume identifiers 221. For example, volume identifier 222 in volume identifiers 221 may define volume 219 in volumes 218.

In these illustrative examples, an identification of volume 219 may be made using sectional view 223 in sectional views 224 in sectional view database 225. Sectional views 224 may include sectional views of the different objects. For example, sectional view 223 may correspond to model 216. An operator may select volumes 218 using sectional view 223 displayed on graphical user interface 208 in this particular example.

As depicted, sectional views 224 in sectional view database 225 may provide views of sections 136 for object 102. In the illustrative examples, sections 136 correspond to sections manufactured for assembly of object 102. In particular, sections 136 may correspond to sections manufactured for assembly of aircraft 104.

Further, sectional views 224 may include different levels of detail. For example, sectional views 224 may include a hierarchy of levels in which the lower levels have more detail about aircraft 104 than higher levels in the hierarchy. In some illustrative examples, a selection of a sectional view in sectional views 224 may result in another sectional view being displayed. In other illustrative examples, a selection made in a sectional view may result in graphical representations 214 being generated from model 216 and displayed on graphical user interface 208. In this manner, an operator may visually query aircraft 104 through the different sectional views in sectional views 224.

As a result, operator interaction generating user input with sectional view 223 displayed in graphical user interface 208 may be used to identify volumes 218 in model 216. The user input may be used to identify volume identifier 222 from volume identifiers 221. Volume identifier 222 may point to volume 219 in model 216.

In these illustrative examples, object visualizer 204 may generate queries using volume identifiers 221 to obtain information from model 216 in model database 215. In particular, the information may be data about volume 219 in model 216 for aircraft 104.

As depicted, object visualizer 204 also may be configured to generate graphical representations 214 for states 226 of object 102. In these illustrative examples, states 226 may be used for object 102 in the form of aircraft 104. In other words, aircraft 104 may have different parts in parts 106 that are installed at different states within states 226. For example, states 226 may include, at least one of a state of fabrication of components, a state of assembly of parts, or other suitable states. In the illustrative example, states 226 may take the form of conditions of assembly 227 for object 102. Conditions of assembly 227 may be different states in which different parts are assembled to form object 102.

In the illustrative example, states 226 may be based on positions 114 of aircraft 104 within assembly location 107 in building 108 in FIG. 1. In these illustrative examples, states 226 may be selected from at least one of planned states 228 or actual states 229.

Aircraft 104 may have different planned states in planned states 228 in different positions in positions 114. In this illustrative example, a planned state in planned states 228 includes the parts that are expected to be installed at a particular position in positions 114. In other words, these parts may or may not have been installed at that position.

In these illustrative examples, the planned state may be based on the past position, current position, or the future position of aircraft 104 in positions 114. In other words, graphical representations 214 may be generated for any position that has occurred, is currently present, or planned for aircraft 104.

As depicted, an actual state in actual states 229 includes parts 106 that have actually been installed in aircraft 104. In other words, a particular state may have a selected number of parts that are installed at that state. The actual state in actual states 229 may be based on at least one of a past position, or the current position of aircraft 104. In other words, graphical representations 214 may be generated for parts 106 actually installed at a prior point in time. This prior point in time may be selected by an operator. In this manner, an operator may view tasks 118 performed to install parts 106 at some prior point in time.

Additionally, the actual state may be the current state of aircraft 104. In other words, graphical representations 214 may be generated for parts 106 that have been installed at the current point in time. In this manner, graphical representations 214 may be used to visualize parts 106 that are currently present in aircraft 104.

In these illustrative examples, the identification of parts that have already been installed or parts installed in prior points in time may be identified using shop order instances 132 in shop order database 212. In particular, shop order instances 132 may indicate what parts in parts 106 have been installed.

Model database 215 is a database of models for objects. In these illustrative examples, these models may be, for example, computer-aided design models (CAD). Of course, any type of model that may provide information about the three-dimensional geometries of objects may be used. Additionally, these models may also include other information about materials, instruction assemblies, or other suitable types of information.

As depicted, inventory identifier 206 is configured to access inventory database 230. Inventory database 230 contains information about parts. Inventory database 230 may include information about whether parts are in stock, when parts will be delivered, the number of parts available, or other suitable types of information.

As depicted, status identifier 207 is configured to provide a visualization of the status for one or more of shop order instances 132. In this illustrative example, status identifier 207 is configured to provide an operator a graphical front end through graphical user interface 208 to identify the status of a shop order instance in a specific location of object 102, such as aircraft 104. This information may be identified without the operator knowing the coordinates of the particular location.

In these illustrative examples, object visualizer 204 is configured to identify a model of object 102, such as aircraft 104. For example, object visualizer 204 may identify the model in model database 215 for object 102.

Status identifier 207 is also configured to identify shop order instances 132 for object 102. The identification may be made through interaction with assignment manager 202.

In the illustrative example, status identifier 207 is also configured to identify status 213 of shop order instances 132. This identification also may be made through assignment manager 202.

Object visualizer 204 is configured to display graphical representations 214 of parts 106 in FIG. 1 for a group of shop order instances 132 in graphical user interface 208 on a display device in display system 209. The generation of graphical representations 214 may be based on the identification of a group of shop order instances 132. In other words, object visualizer 204 is configured to receive an identification of parts in the group of shop order instances 132. The identification of these parts may be used to generate graphical representations 214.

Further, status identifier 207 is also configured to display a set of graphical indicators 231 in association with graphical representations 214 of parts 106 displayed on graphical user interface 208 by object visualizer 204. As used herein, a "set of," when used with reference items, means one or more items. For example, a set of graphical indicators 231 is one or more of graphical indicators 231.

In these illustrative examples, a graphical indicator in graphical indicators 231 is considered to be displayed in association with a graphical representation in graphical representations 214 when the attention of an operator viewing graphical indicators 231 is drawn to the parts. Thus, the graphical indicator may be displayed as part of the graphical representation, on the graphical representation, in some proximity of the graphical representation, or in some other suitable manner that draws attention to the graphical representation.

The set of graphical indicators 231 displayed in association with graphical representations 214 of parts 106 may take different forms. For example, the set of graphical indicators 231 may be selected from at least one of a color, cross hatching, an icon, high lighting, animation, or other suitable types of graphical indicators.

Further, the group of shop order instances 132 may be identified in a number of different ways. For example, the group of shop order instances 132 may be identified by a user input to graphical user interface 208 from an operator. For example, the user input received may be a selection of the group of shop order instances 132.

In another illustrative example, the identification of the group of shop order instances 132 may be identified from a user input selecting a group of parts 106 in object 102 in FIG. 1. The selection of the group of parts 106 may be one of a selection of the group of parts 106 from a list of parts 106 and a selection of the group of parts 106 from a display of graphical representations 214 of parts 106 in graphical user interface 208.

Additionally, status identifier 207 may display information about a shop order instance for a part selected from graphical representations 214 of parts 106 displayed in graphical user interface 208.

With this information in graphical user interface 208, real-world operations may be performed. For example, the assembly of object 102 in FIG. 1 may be managed based on graphical representations 214 of parts 106 for shop order instances 132 and the set of graphical indicators 231 displayed on graphical user interface 208. For example, identifications of operations that should be performed may be made using this visualization. These operations may include when particular parts should be assembled, when inspections of parts assembled in object 102 should be made, or other suitable types of operations.

In FIG. 2, different components are illustrated as being located in object manager 124. These different components may be used as part of different systems. The systems may include at least one of object visualization system 134 in FIG. 1, shop order status visualization system 135 in FIG. 1, and other suitable systems. A component in object manager 124 may be used in more than one system. For example, object visualizer 204 may be in both object visualization system 134 and shop order status visualization system 135. In other words, the different components illustrated in object manager 124 may be used at the same time by different systems in object manager 124.

Figure 3:
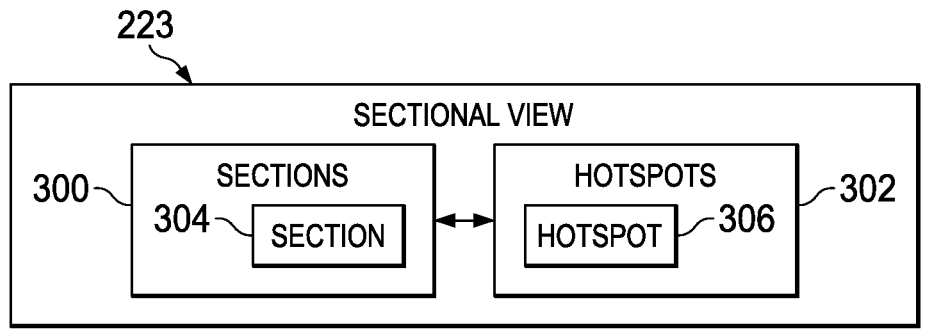
FIG. 3 is an illustration of a block diagram of a sectional view in accordance with an illustrative embodiment.

Turning now to FIG. 3, an illustration of a block diagram of a sectional view is depicted in accordance with an illustrative embodiment. An example of one implementation for sectional view 223 in FIG. 2 is shown.

As depicted, sectional view 223 includes a number of different pieces of information. For example, sectional view 223 includes sections 300 and hotspots 302.

Sections 300 are graphical representations corresponding to sections 136 for object 102 and, in particular, aircraft 104 in FIG. 1. In these illustrative examples, sections 300 may be located in a single image, multiple images, or some other suitable form. Further, sections 300 are graphical representations corresponding to sections 136 manufactured for assembly of aircraft 104.

In these illustrative examples, sections 300 may be selectable. A selection of section 304 in sections 300 having hotspot 306 in hotspots 302 results in a volume corresponding to section 304 in model 216 being displayed in this illustrative example. Hotspot 306 may be a pointer to volume identifier 222 associated with volume 219. For example, hotspot 306 may include a universal resource locator, or some other addressing convention to identify volume identifier 222 from volume identifiers 221 in volume database 220.

Figure 4:
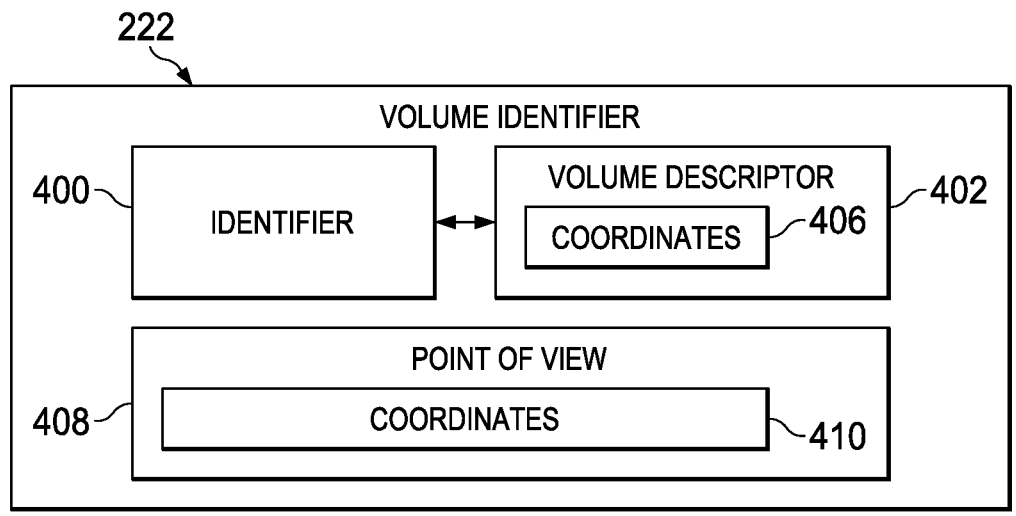
FIG. 4 is an illustration of a block diagram of a volume identifier in accordance with an illustrative embodiment.

Turning now to FIG. 4, an illustration of a block diagram of a volume identifier is depicted in accordance with an illustrative embodiment. In this illustrative example, one implementation for volume identifier 222 in FIG. 2 is shown.

Volume identifier 222 includes a number of components. As depicted, volume identifier 222 includes identifier 400 and volume descriptor 402.

Identifier 400 distinguishes volume identifier 222 from others of volume identifiers 221 that may be present in volume database 220. Identifier 400 may take various forms. For example, identifier 400 may be a word, a phrase, a number, an alphanumeric string, or some other suitable form.

Volume descriptor 402 describes the volume in model 216. For example, volume descriptor 402 may take the form of coordinates 406. Coordinates 406 are in the coordinate system used by model 216 in this example. For example, coordinates 406 may be three coordinates that may be used to define a polygon, a cube, or a cuboid. Of course, other information may be present in volume descriptor 402 other than coordinates 406. For example, volume descriptor 402 may include a single coordinate and a radius used to define volume 219 in a form of a sphere. In still other illustrative examples, a single coordinate may be present with pre-selected offsets that define volume 219 as a cube or some other shape.

In some illustrative examples, volume identifier 222 may also include point of view 408. Point of view 408 may define the view of the volume displayed to an operator when graphical representations 214 are displayed on graphical user interface. For example point of view 408 may include coordinates 410 of the point of view using the coordinate system for the volume.

Figure 5:
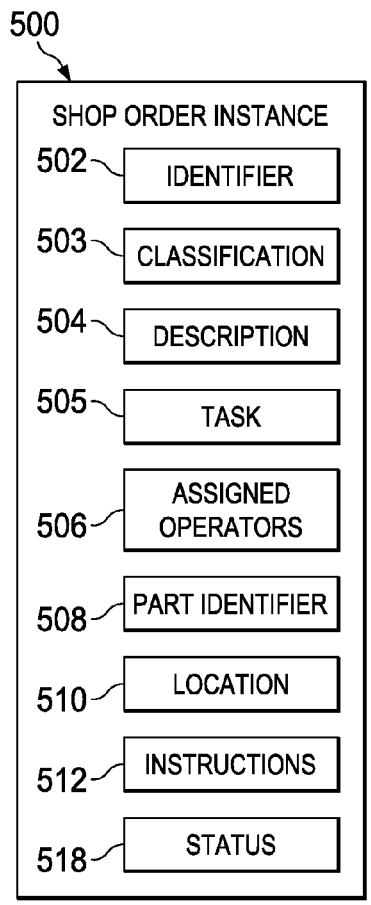
FIG. 5 is an illustration of a block diagram of a shop order instance in accordance with an illustrative embodiment.

With reference now to FIG. 5, an illustration of a block diagram of a shop order instance is depicted in accordance with an illustrative embodiment. As depicted, shop order instance 500 is an example of a shop order instance from shop order instances 132 in FIG. 1.

As depicted, shop order instance 500 may include a number of different parts. Shop order instance 500 includes identifier 502, classification 503, description 504, task 505, assigned operators 506, part identifier 508, location 510, instructions 512, and status 518.

As depicted, identifier 502 may be used to uniquely identify a task in tasks 118 in FIG. 1. Identifier 502 may be an alphanumeric identifier, a number, or some other suitable type of identifier.

In the illustrative example, classification 503 is used to classify the shop order instance. This classification may be based on the type of task to be performed. For example, the classifications may include seat installation, wiring, line replaceable unit installation, or other suitable types of classifications. The classification may be descriptive or may take the form of an identifier or other type of code.

Description 504 provides a description of task 505. This description may be a short description to provide the operator information about task 505. The description may be several words or a single sentence in some illustrative examples.

Task 505 identifies the work to be performed. For example, task 505 may be to install a part, assemble parts, perform an inspection, or some other suitable piece of work.

Assigned operators 506 identifies a group of operators that may be assigned to perform task 505. In some cases, an operator may not yet be assigned to perform task 505 for shop order instance 500.

In this illustrative example, part identifier 508 identifies a part assembled in object 102 using shop order instance 500. In this illustrative example, part identifier 508 is a part number for the part. For example, part identifier 508 may be a serial number, a combination of a serial number and vendor identifier, or some other suitable type of identification that uniquely identifies a particular part from other parts even if those parts are the same type.

In the illustrative examples, part identifier 508 may be used to generate the graphical representation of the parts identified. For example, part identifier 508 may be used to locate the information in a model needed to generate the graphical representation of the part for display.

Location 510 identifies the location where task 505 is to be performed. This location may be in coordinates for object 102 or some other coordinate system.

Instructions 512 are a group of instructions for performing task 505. In particular, the group of instructions may be for assembling a group of parts. These instructions may be step-by-step instructions, guidance, or other suitable types of instructions. These instructions may provide guidance for assembling parts, inspecting parts, or other suitable operations that may be performed for task 505. Instructions 512 also may include plans for the location in which task 505 is to be performed.

As depicted, status 518 provides information about the performance of task 505 for shop order instance 500. In this illustrative example, the status may indicate that work is to be performed, has been completed, is in progress, is unassigned, has been planned, is on hold, has been canceled, or some other suitable status for shop order instance 500. The status may be indicated using text, codes, symbols, or other suitable mechanisms. Additionally, if status 518 indicates that the work to be performed has been completed, status 518 also may include a date and time of when work for performing task 505 occurred.

Figure 6:
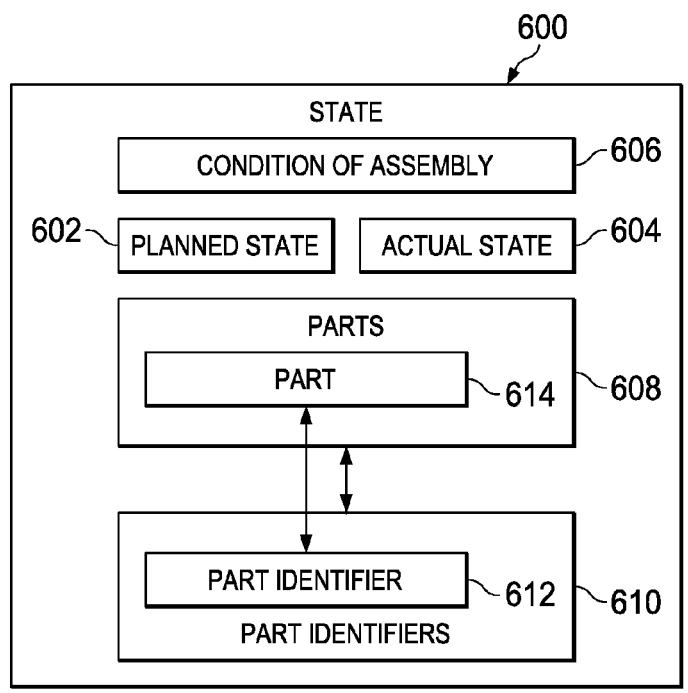
FIG. 6 is an illustration of a block diagram of a state for a section of an aircraft in accordance with an illustrative embodiment.

Turning next to FIG. 6, an illustration of a block diagram of a state for a section of an aircraft is depicted in accordance with an illustrative embodiment. In this depicted example, state 600 is an example of the state in states 226.

In this illustrative example, state 600 is a data structure that stores information about parts that may be present for state 600. This data structure may be, for example, a flat file, a linked list, a record in a database, or some other suitable type of data structure.

State 600 may take the form of planned state 602, actual state 604, or both. In these illustrative examples, state 600 may be condition of assembly 606 for a particular position of aircraft 104 in positions 114. In particular, condition of assembly 606 may be a condition of assembly in conditions of assembly 227 in FIG. 2.

In this illustrative example, state 600 includes parts 608. Parts 608 are parts present in aircraft 104 for state 600 selected for aircraft 104. As depicted, parts 608 may be identified using part identifiers 610. Part identifiers 610 may take various forms. For example, part identifier 612 in part identifiers 610 may be a part number for part 614 in parts 608. For example, part identifier 612 may be a serial number, a combination of a serial number and vendor identifier, or some other suitable type of identification. In the illustrative examples, part identifier 612 may be any identifier that uniquely identifies a particular part from other parts even if those parts are the same type.

In this illustrative example, state 600 may be used by object visualizer 204 in object manager 124 to generate graphical representations 214 for parts 608 that may be present for state 600. In these illustrative examples, state 600 represents a particular position of aircraft 104 in positions 114. As a result, only parts 608 present for aircraft 104 are displayed in graphical representations 214 on graphical user interface 208.

The illustration of the different components that may be used in manufacturing environment 100 in FIGS. 1-6 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment. For example, although the illustrative examples are described with respect to an aircraft, an illustrative embodiment may be applied to other objects other than aircraft, such as, for example, without limitation, a vehicle, a submarine, a personnel carrier, a tank, a train, an automobile, a bus, a spacecraft, a surface ship, a spacecraft, a satellite, a rocket, an engine, a computer, harvesters, construction cranes, bulldozers, mining equipment, or other suitable types of objects.

In another illustrative example, a selection of section 304 with hotspot 306 may result in an inquiry being generated directly without using volume database 220. For example, hotspot 306 may include a query for the volume corresponding to section 304.

With reference now to FIGS. 7-13, the illustrations of the display of graphical user interfaces for viewing an aircraft in different states are depicted in accordance with an illustrative embodiment. These figures illustrate one manner in which graphical user interface 208 in FIG. 2 may be implemented. The different graphical user interfaces may be displayed on a display system, such as display system 209 in FIG. 2, and an operator may interact with the graphical user interfaces using an input system, such as input system 211 in FIG. 2.

Figure 7:
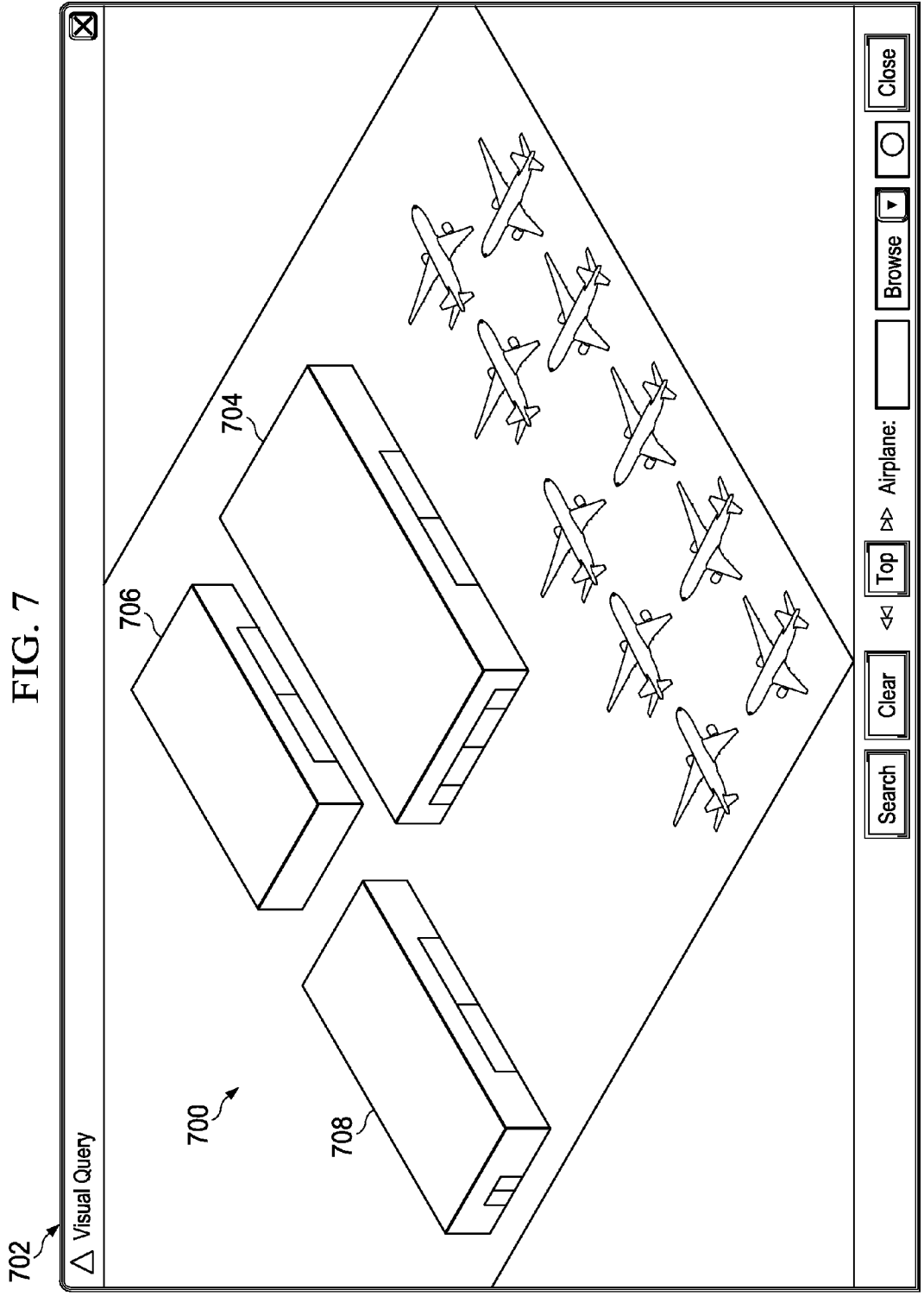
FIG. 7 is an illustration of a graphical user interface for viewing statuses of shop order instances in accordance with an illustrative embodiment.

With reference to FIG. 7, an illustration of a graphical user interface for identifying a model of an aircraft for viewing is depicted in accordance with an illustrative embodiment. In this illustrative example, graphical user interface 700 displays buildings 702 including building 704, building 706, and building 708.

In this particular example, each building in buildings 702 in graphical user interface 700 represents a location where manufacturing of aircraft occurs. Each building may correspond to a database of aircraft that are manufactured within the building.

Figure 8:
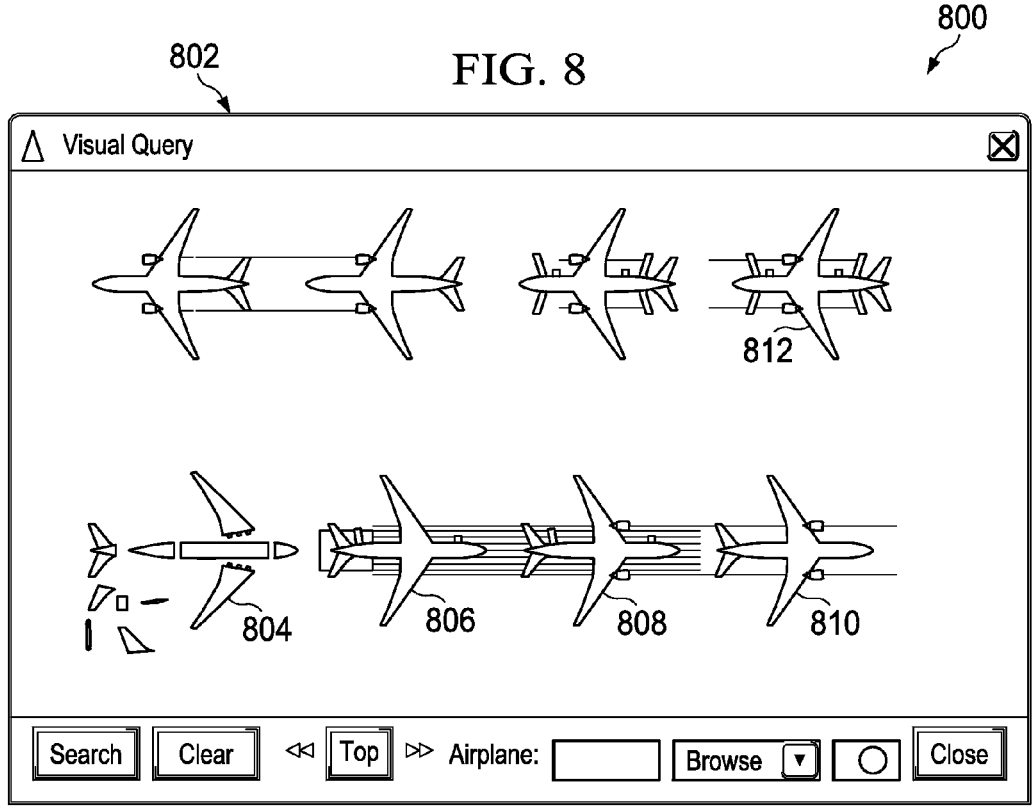
FIG. 8 is an illustration of a graphical user interface of aircraft positions in a building in accordance with an illustrative embodiment.

Turning now to FIG. 8, an illustration of a graphical user interface of aircraft positions in a building is depicted in accordance with an illustrative embodiment. In this illustrative example, aircraft positions 800 are displayed in graphical user interface 802. These positions correspond to tasks that may be performed at different stages of the assembly of an aircraft.

In this particular example, aircraft positions 800 include position 804, position 806, position 808, position 810, and position 812. In these illustrative examples, certain tasks are performed in different positions in aircraft positions 800. In other words, the aircraft assembly progresses from position to position with different parts being added to the aircraft at the different positions in aircraft positions 800.

A selection of one of these positions results in identifying graphical representations for parts that would be installed at a particular position as well as any parts that may have been installed from a prior position. As a result, parts that are not to be installed into a subsequent position are not present. For example, an aircraft in position 812 is a fully configured aircraft. An aircraft in position 810 may not have seats and carpet. An aircraft in position 808 may not include stove ends, lavatories, galleys, and other parts. These different positions in aircraft positions 800 may have different conditions of assembly for the aircraft in these illustrative examples.

Additionally, in these illustrative examples, shop order instances in a shop order database may be identified for each of the positions. In other words, each position may have a shop order database containing shop order instances that may be generated for those particular positions. As a result, positions with fewer parts have less shop order instances to monitor or manage. In this manner, faster query of a shop order database for a particular position may be made when that database is for a position with fewer parts. After the selection of the position, an operator may select a section of aircraft for review.

Figure 9:
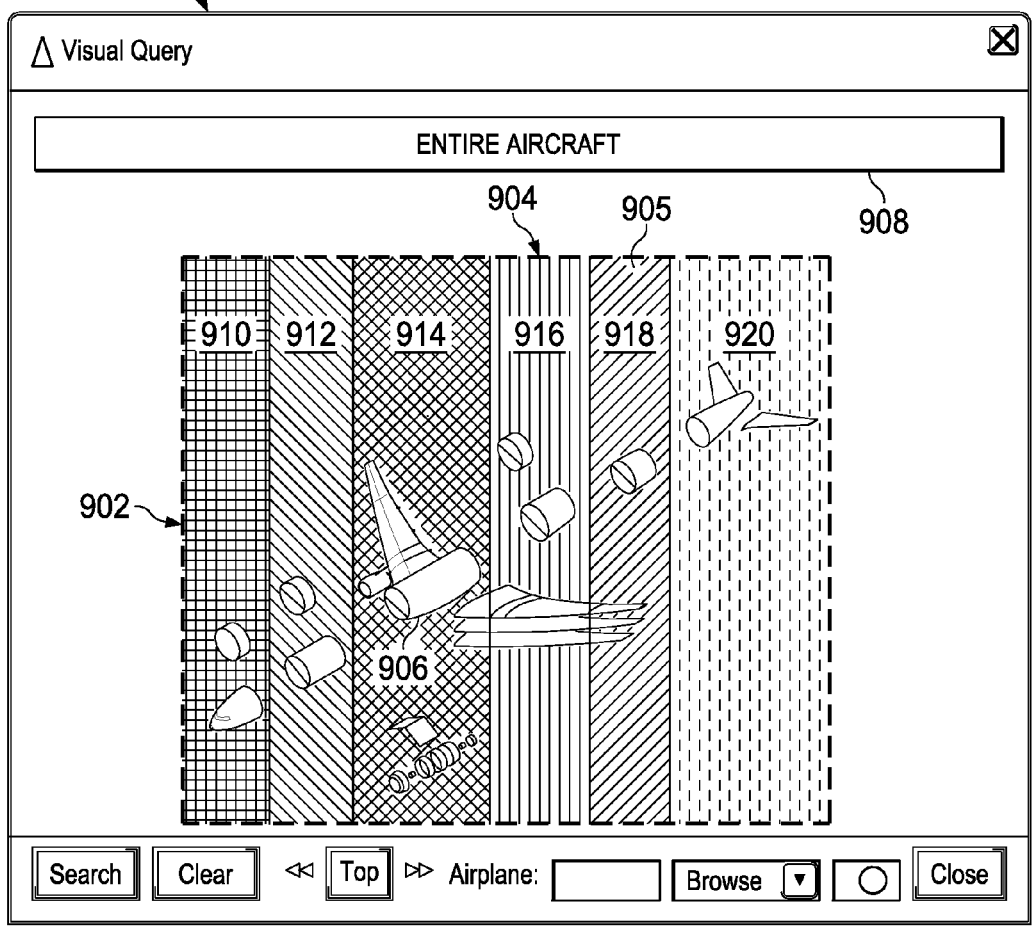
FIG. 9 is an illustration of a graphical user interface of aircraft sections in accordance with an illustrative embodiment.

Turning now to FIG. 9, an illustration of a graphical user interface of aircraft sections is depicted in accordance with an illustrative embodiment. In this illustrative example, graphical user interface 900 displays sections 902 for an aircraft in area 904 of graphical user interface 900.

As depicted, sectional view 905 is displayed in area 904 of graphical user interface 900. Sectional view 905 is an example of one implementation for sectional view 223 shown in block form in FIG. 2 and FIG. 3. In this particular example, sectional view 905 may be for an aircraft in position 812 in FIG. 8.

An operator may select a section from sections 902. As depicted, sections 902 are examples of sections 300 in FIG. 3 as displayed in graphical user interface 900. Sections 902 are selectable in this particular example. In other words, sections 902 may include hotspots. These hotspots are not seen in this illustrative example. Hotspots are areas in graphical user interface 900 that may be selected to cause an action. In these illustrative examples, these hotspots correspond to sections 902. The hotspots may encompass sections 902 or may be around sections 902 or some combination thereof.

As another example, section 906 is an example of a section in sections 902 that may be selected. A selection of this section results in a more detailed illustration of section 906 being displayed. In this example, section 906 is an upper barrel portion of an aircraft.

Additionally, an identification of the parts present in the section is also made in response to the user selection of a particular section. This identification may include any parts that are present for the particular position of the aircraft in that section. In other words, the same section of an aircraft in different positions may have different parts that are present based on tasks for installing parts. This identification may be made through the use of states 226 in FIG. 2.

In the illustrative example, an operator may select to view the entire aircraft by selecting entire aircraft area 908 in graphical user interface 900. In other words, the volume for display may be the entire aircraft. Further, an operator may select groups of sections 902. As depicted, the selection may be made by selecting one of area 910, area 912, area 914, area 916, area 918, and area 920 in graphical user interface 900. In these illustrative examples, these areas have hotspots. In this manner, an operator may view different portions of an aircraft in a manner that suits the particular query that is the operator desires.

Figure 10:
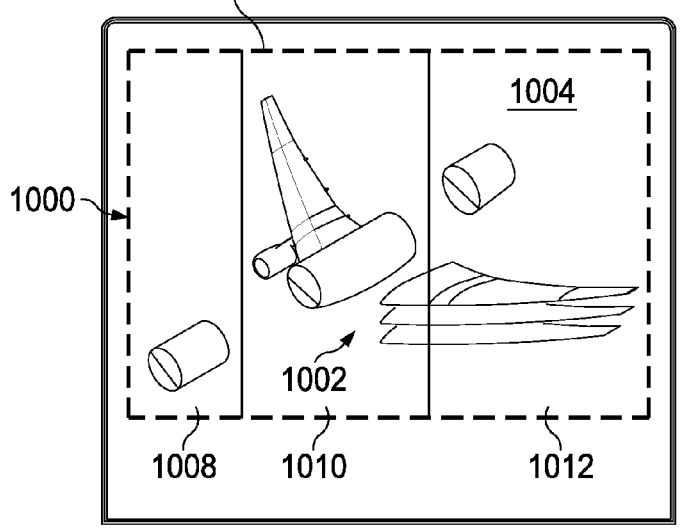
FIG. 10 is another illustration of a graphical user interface of aircraft sections in accordance with an illustrative embodiment.

Turning now to FIG. 10, another illustration of a graphical user interface of aircraft sections is depicted in accordance with an illustrative embodiment. In this illustrative example, graphical user interface 1000 displays sections 1002 for an aircraft in area 1004 of graphical user interface 1000.

As depicted, sectional view 1005 is displayed in area 1004 of graphical user interface 1000. Sectional view 1005 is an example of one implementation for sectional view 223 shown in block form in FIG. 2 and FIG. 3. In this particular example, sectional view 1005 may be for an aircraft in position 804 in FIG. 8.

In this illustrative example, only a portion of an aircraft is illustrated in the view of sections 1002 in sectional view 1005. As depicted, only sections 1002 that are present in a particular position are shown in this particular example.

Further, sections 1002 also may be selectable. The selectable ability of sections 1002 may be enabled through the use of hotspots associated with sections 1002. As a result, the selection of a particular section in sections 1002 may result in the display of the volume from a model of aircraft containing the selected section.

As depicted, area 1008, area 1010, and 1012 are also selectable. These areas may also have hotspots associated with them. The selection of one of these areas results in a volume containing the different sections within an area being displayed.

The illustration of graphical user interface 700 with buildings 702 in FIG. 7, graphical user interface 802 with aircraft positions 800 in FIG. 8, and graphical user interface 900 with sections 902 in FIG. 9, and graphical user interface 1000 with sections 1002 in FIG. 10 are examples of multilevel querying that may be performed in accordance with an illustrative embodiment. As depicted, the selection of a building from buildings 702 may select a particular model for an aircraft. The particular model may be displayed with positions using graphical user interface 802. The selection of a position may result in another view being displayed with sections 902 in graphical user interface 900 or sections 1002 in graphical user interface 1000. In this manner, an operator may more easily traverse models of different aircraft, depending on the position selected.

Figure 11:
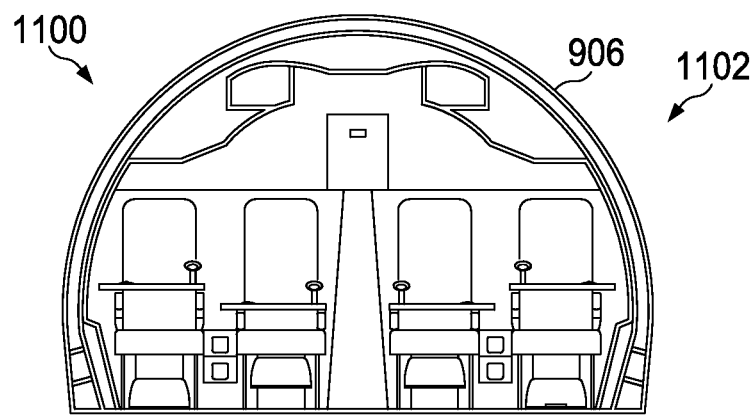
FIG. 11 is an illustration of a section of an aircraft in accordance with an illustrative embodiment.
Figure 12:
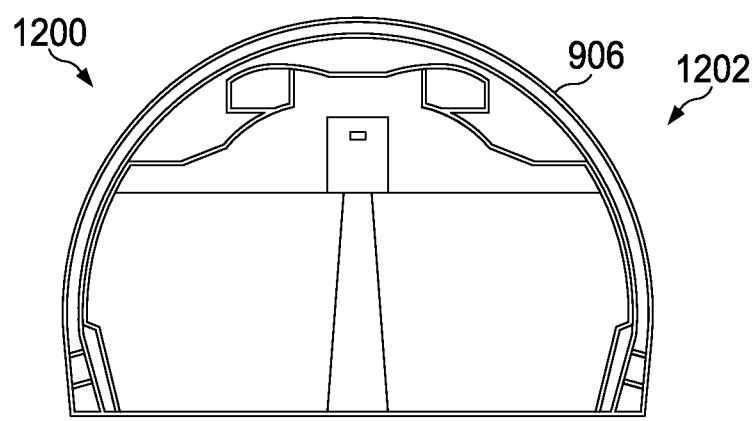
FIG. 12 is another illustration of a section of an aircraft in accordance with an illustrative embodiment.
Figure 13:
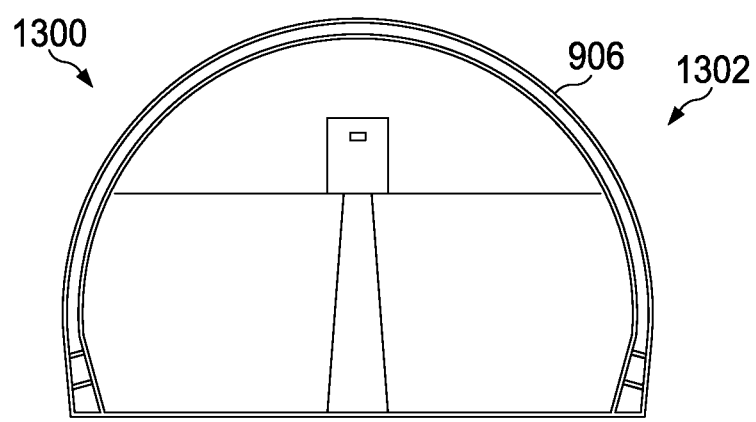
FIG. 13 is still another illustration of a section of an aircraft in accordance with an illustrative embodiment.

As depicted, FIGS. 11-13 are illustrations of a section of an aircraft in different positions in a factory, such as manufacturing facility 112 in FIG. 1. These figures show the same section with different parts to reflect the state of aircraft in different assembly positions. In particular, each figure shows the same section of aircraft in a different condition of assembly.

With reference now to FIG. 11, an illustration of a section of an aircraft is depicted in accordance with an illustrative embodiment. In this illustrative example, section 906 of the aircraft is displayed in graphical user interface 1100.

In this illustrative example, parts 1102 displayed within section 906 in graphical user interface 1100 are parts present in position 812 in FIG. 8. In other words, section 906 shows parts 1102 in a completed aircraft.

With reference now to FIG. 12, an illustration of a section of an aircraft is depicted in accordance with an illustrative embodiment. In this illustrative example, section 906 of the aircraft is displayed in graphical user interface 1200. In this display of section 906, parts 1202 are parts that are present within section 906 in position 810 of the aircraft in FIG. 8. As seen, fewer parts are present in this view of section 906 as compared to view of section 906 to in FIG. 11.

With reference now to FIG. 13, an illustration of a section of an aircraft is depicted in accordance with an illustrative embodiment. In this illustrative example, section 906 of the aircraft is displayed in graphical user interface 1300. In this display of section 906, parts 1302 are parts that are present within section 906 in position 808 of the aircraft in FIG. 8. As can be seen, even fewer parts are present in this view of section 906 as compared to the view of section 906 in FIG. 12.

FIGS. 11-13 are only intended as some illustrative examples of parts that may be displayed in a section that reflect a state of an aircraft and, in particular, a condition of assembly of an aircraft. The different states illustrated in FIGS. 11-13 may be for planned states or actual states.

The illustrations of the different graphical user interfaces in FIGS. 7-13 are provided only as examples of some implementations for graphical user interface 208 in FIG. 2. These examples are not meant to limit the manner in which an illustrative embodiment may be implemented. For example, although the different examples are displayed with reference to aircraft, similar displays may be used for other types of vehicles or objects. For example, the graphical user interfaces may be configured for sections of objects such as an automobile, a ship, a satellite, an engine, or some other suitable type of object.

As another illustrative example, the display of the different graphical user interfaces may be performed using other graphical user interfaces in addition to or in place of the ones depicted. Further, the order of the graphical user interfaces may vary from the order described above.

As depicted above, the display of a condition of assembly for an aircraft has been shown in a section in the aircraft in FIGS. 11-13. In other illustrative examples, the condition of assembly may be shown for the entire aircraft or some other type of partitioning other than the ones illustrated herein.

Figure 14:
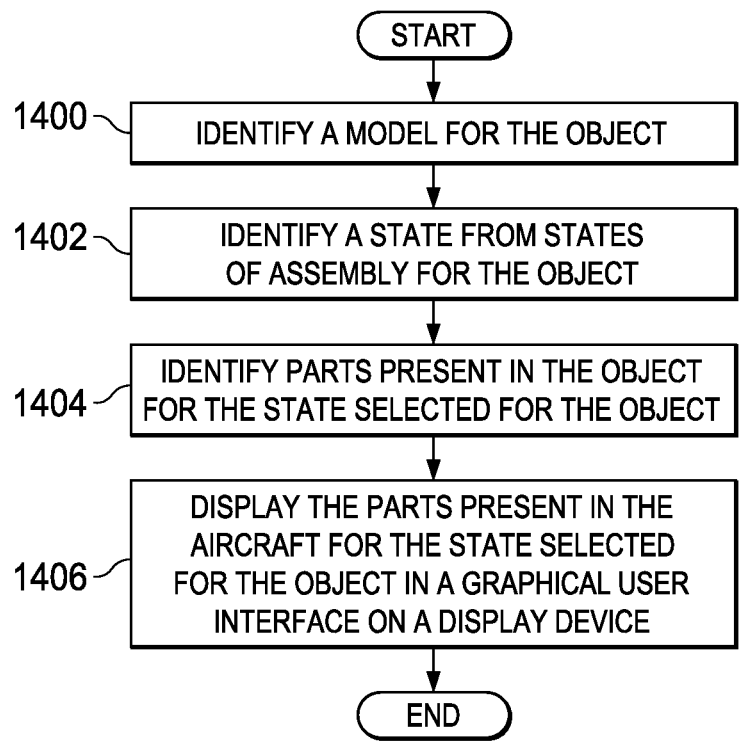
FIG. 14 is an illustration of a flowchart of a process to identify a state of an object in accordance with an illustrative embodiment.

With reference next to FIG. 14, an illustration of a flowchart of a process to identify a state of an object is depicted in accordance with an illustrative embodiment. In this illustrative example, the method may be used to visually query an object such as an aircraft. The process may be implemented using object manager 124 in FIG. 1. In particular, one or more of the different components for object manager 124 illustrated in FIG. 2 may be used to visually query an aircraft.

In these illustrative examples, this process may be used to identify a state of an object, such as an aircraft. The state may be a condition of assembly.

The process begins by identifying a model for the object (operation 1400). In the illustrative examples, a model for the object may be identified in a number of ways as described above. For example, a model may be identified by selecting the model from a list of models. In other illustrative examples, the model may be identified visually using a graphical user interface such as graphical user interface 700 in FIG. 7.

Next, the process identifies a state from states of assembly for the object (operation 1402). In these illustrative examples, the state may be based on a position of the object within a manufacturing facility. In other illustrative examples, the state may be based on other criteria. For example, the criteria may be based on time in addition to or in place of the location of the aircraft. In these illustrative examples, the state may be a condition of assembly for the object.

The process then identifies parts present in the object for the state selected for the object (operation 1404). The visualized parts are the parts that have been assembled for the aircraft in the particular state. As a result, depending on the state selected, the object may have different parts for the state.

The process then displays the parts present in the aircraft for the state selected for the object in a graphical user interface on a display device (operation 1406), with the process terminating thereafter. In some illustrative examples, sections of aircraft are displayed with the parts present in the aircraft for the state selected in the graphical user interface. In other words, the display similar to graphical user interface 900 may be used to display sections 902. The sections correspond to sections manufactured for assembly of aircraft.

In other words, the sections displayed for the aircraft may vary depending on the state. For example, the state of the aircraft in graphical user interface 900 in FIG. 9 is different from the state of the aircraft in graphical user interface 1000 in FIG. 10. The different sections may be present for different states. Additionally, within the same section, different parts may be present based on the parts that have been assembled so far.

Further, the sections also are selectable in the illustrative examples. The ability to initially select which section to begin the object visualization may be provided through various mechanisms. In the illustrative example, the selectability may be provided through hot spots associated with the sections that are displayed in the graphical user interface. Further, the sections are displayed in an exploded view in operation 1406.

Figure 15:
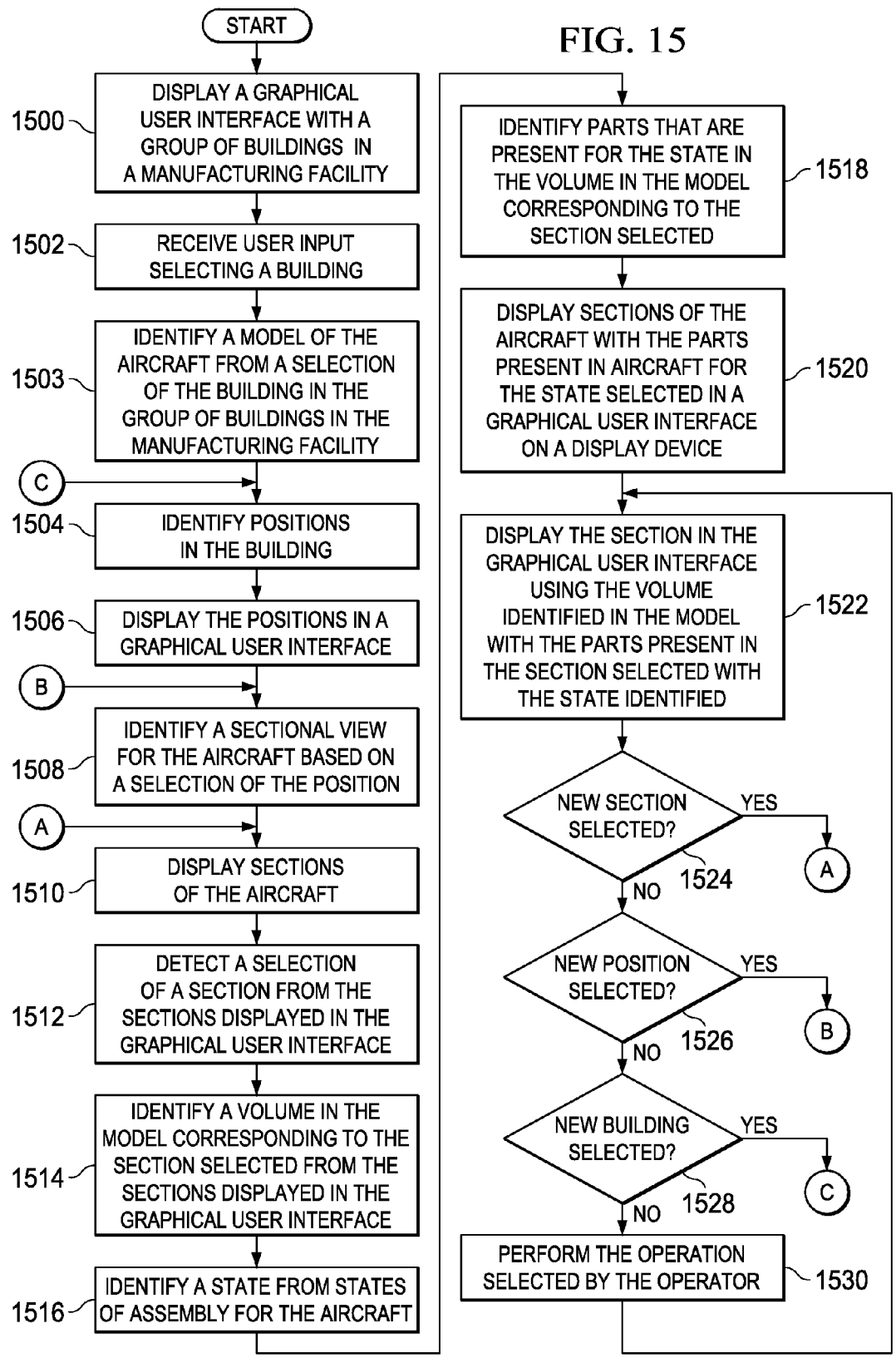
FIG. 15 is an illustration of a more detailed flowchart of a process for identifying a state of an aircraft in accordance with an illustrative embodiment.

Turning now to FIG. 15, an illustration of a more detailed flowchart of a process for identifying a state of an aircraft is depicted in accordance with an illustrative embodiment. This process is one illustrative example of identifying states and, in particular, conditions of assembly for an aircraft. The process illustrated in this figure may be implemented in object manager 124. In particular, this process may be part of object visualization system 134. One or more operations illustrated may be implemented using object visualizer 204 in FIG. 2.

The process begins by displaying a graphical user interface with a group of buildings in a manufacturing facility (operation 1500). The graphical user interface includes hotspots for the buildings that can be selected. A hotspot is a portion of the graphical user interface that may be selected to cause an action. In these illustrative examples, the buildings are hotspots that may be selected by an operator.

The process then receives user input selecting a building (operation 1502). In the illustrative example, each building may be used to assemble a particular aircraft. The particular aircraft may be a particular type of aircraft such as the model. In some cases, more than one building may be used to assemble the same type of aircraft, but the particular aircraft may be a specific build for a customer with specific options. In other words, different aircraft of the same type may be assembled in different buildings that have different options although they are of the same type.

Next, a model of the aircraft is identified from a selection of the building in the group of buildings in the manufacturing facility (operation 1503). Positions in the building are identified (operation 1504). Each building may have different positions for the aircraft that are being assembled. Further, even if a building has the same positions, the status of an aircraft at a particular building at particular positions may be different from other buildings. Further, even with the same positions, different aircraft may be assembled in the positions in different buildings.

The positions are displayed in a graphical user interface (operation 1506). In these illustrative examples, the different positions are hotspots that may be selected through user input entered by an operator. The process then receives user input for selecting a position.

The process then identifies a sectional view for the aircraft based on a selection of the position (operation 1508). In the illustrative example, each position may have a different sectional view that may be displayed. The sections of aircraft in a position are the sections manufactured at the position selected in these illustrative examples. The sectional view includes sections for that particular position.

As depicted, the sectional view may be, for example, sectional view 223 in sectional views 224 in FIG. 2. Different sectional views are present for different positions in the illustrative example. Sectional view 905 in FIG. 9 and sectional view 1005 in FIG. 10 are examples of sectional views that may be selected depending on the position selected for the aircraft in operation 1508.

In these illustrative examples, the sectional views were selected for parts that are present in the aircraft for the position. These are parts that may already be present from assembly of the aircraft in a prior position or may be parts that are to be assembled in the position selected.

The process then displays sections of the aircraft (operation 1510). In operation 1510, the sections are displayed in the sectional view of the aircraft. Further, the different sections are displayed in association with hotspots that may be selected by user input entered by an operator. The process then detects a selection of a section from the sections displayed in the graphical user interface (operation 1512). In operation 1512, the section has hotspots associated with the volume identifier. The selection of a section of an aircraft involves selecting the hot spot associated with the aircraft. The hot spot points to a volume identifier, such as volume identifier 222 in FIG. 2. In some cases, the hotspot may be a link pointing to the volume identifier. For example, the hotspot may be an index used to identify a volume identifier.

The process then identifies a volume in the model corresponding to the section selected from the sections displayed in the graphical user interface (operation 1514). In these illustrative examples, each section of an aircraft is associated with the volume for the aircraft. This volume is identified from volume identifiers associated with sections in the sectional view using the volume identifier pointed to by the hotspot selected for the section. The volume identifier may include information defining the volume. For example, volume identifier 222 may include volume descriptor 402 as depicted in FIG. 4. In particular, the volume identifier may include a group of coordinates defining the volume in the model.

Next, the process identifies a state from states of assembly for the aircraft (operation 1516). In these illustrative examples, the state of assembly may be a condition of assembly based on the position of the aircraft within a manufacturing facility. The process then identifies parts that are present for the state in the volume in the model corresponding to the section selected (operation 1518). These parts that are present are ones that are present for a particular state for the aircraft.

Next, sections of the aircraft with the parts present in aircraft for the state selected are displayed in a graphical user interface on a display device (operation 1520). The process then displays the section in the graphical user interface using the volume identified in the model with the parts present in the section selected with the state identified (operation 1522).

Next, a determination is made as to whether a new section of the aircraft has been selected for the position of the aircraft (operation 1524). If any section has been selected, the process then returns to operation 1510 as described above.

If a new section has not been selected, a determination is made as to whether a new position has been selected for the aircraft (operation 1526). If a new position has been selected, the process then returns to operation 1508 as described above. If a new position has not been selected, the process determines whether a new building has been selected (operation 1528). If a new building has been selected, the process returns to operation 1504. Otherwise, the process performs the operation selected by the operator (operation 1530), with the process then returning to operation 1522. In operation 1530, the operator may rotate the parts displayed in the volume, magnify the display, remove parts, annotate parts, or perform other operations with respect to the parts displayed in the volume.

Figure 16:
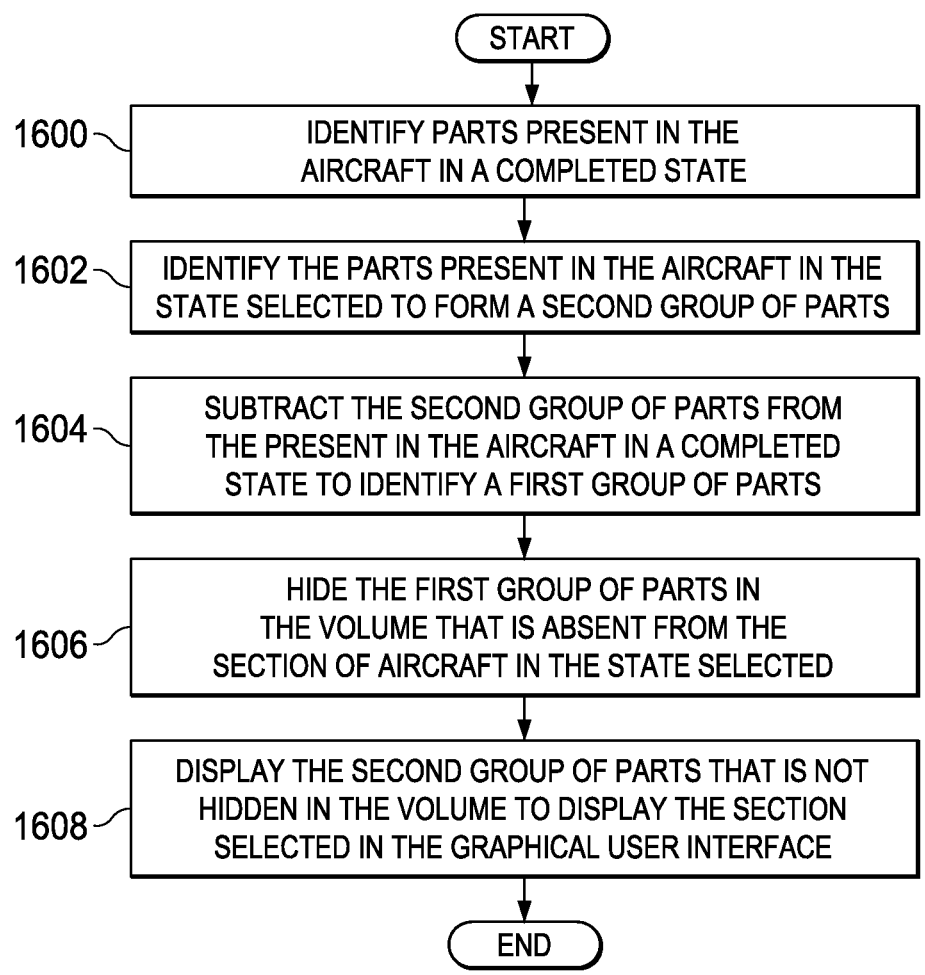
FIG. 16 is an illustration of a flowchart for displaying a section in a graphical user interface in accordance with an illustrative embodiment.

Turning now to FIG. 16, an illustration of a flowchart for displaying a section in a graphical user interface is depicted in accordance with an illustrative embodiment. The different operations illustrated in FIG. 16 are examples of an implementation for operation 1522 in FIG. 15.

The process identifies the parts present in the aircraft in a completed state (operation 1600). Thereafter, the process identifies the parts present in the aircraft in the state selected to form a second group of parts (operation 1602). The second group of parts is subtracted from the parts present in the aircraft in a completed state to identify a first group of parts (operation 1604).

The process hides the first group of parts in the volume that is absent from the section of aircraft in the state selected (operation 1606). The second group of parts that is not hidden in the volume is displayed to display the section selected in the graphical user interface (operation 1608), with the process terminating thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

In one illustrative example, sections may not be displayed in an exploded view in operation 1406. Instead, the sections may be displayed as a whole aircraft in which different sections may be selected through hotspots. The different sections may be indicated using lines or other graphical indicators in this type of implementation.

Figure 17:
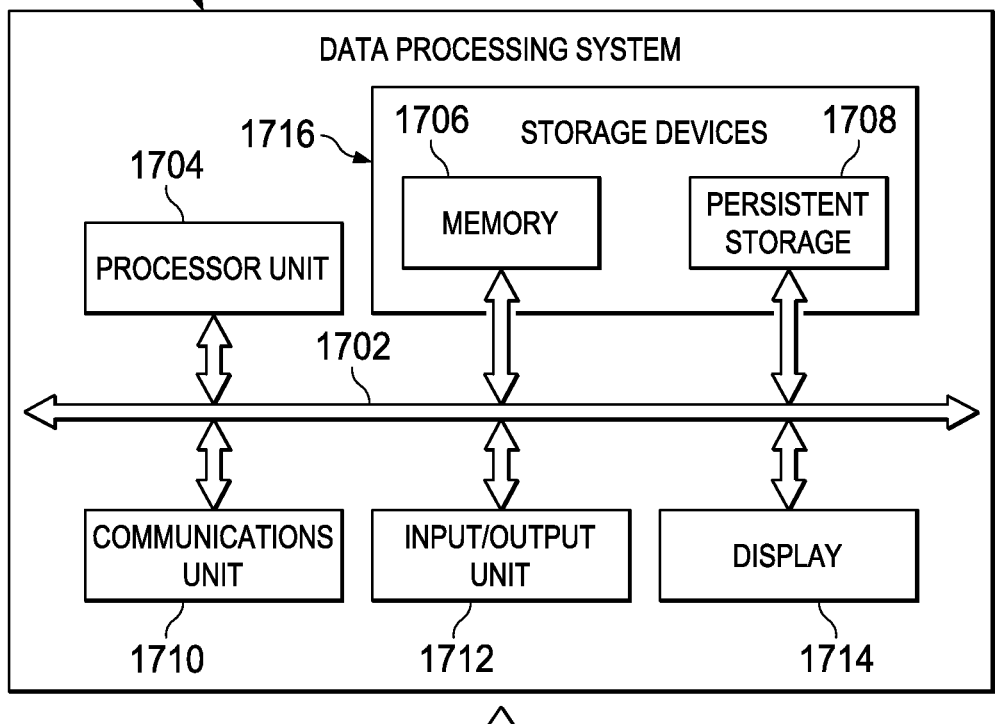
FIG. 17 is an illustration of a block diagram of a data processing system in accordance with an illustrative embodiment.
Figure 17:
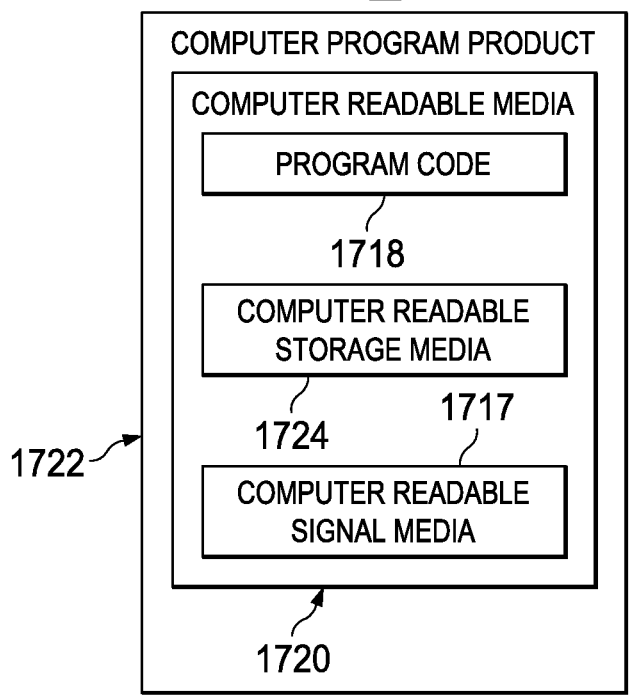

Turning now to FIG. 17, an illustration of a block diagram of a data processing system is depicted in accordance with an illustrative embodiment. Data processing system 1700 may be used to implement computer system 126 in FIG. 1. In this illustrative example, data processing system 1700 includes communications framework 1702, which provides communications between processor unit 1704, memory 1706, persistent storage 1708, communications unit 1710, input/output unit 1712, and display 1714. In this example, communications framework may take the form of a bus system.

Processor unit 1704 serves to execute instructions for software that may be loaded into memory 1706. Processor unit 1704 may be a number of processors, a multi-processor core, or some other type of processor, depending on the particular implementation.

Memory 1706 and persistent storage 1708 are examples of storage devices 1716. A storage device is any piece of hardware that is capable of storing information, such as, for example, without limitation, data, program code in functional form, and/or other suitable information either on a temporary basis and/or a permanent basis. Storage devices 1716 may also be referred to as computer readable storage devices in these illustrative examples. Memory 1706, in these examples, may be, for example, a random access memory or any other suitable volatile or non-volatile storage device. Persistent storage 1708 may take various forms, depending on the particular implementation.

For example, persistent storage 1708 may contain one or more components or devices. For example, persistent storage 1708 may be a hard drive, a flash memory, a rewritable optical disk, a rewritable magnetic tape, or some combination of the above. The media used by persistent storage 1708 also may be removable. For example, a removable hard drive may be used for persistent storage 1708.

Communications unit 1710, in these illustrative examples, provides for communications with other data processing systems or devices. In these illustrative examples, communications unit 1710 is a network interface card.

Input/output unit 1712 allows for input and output of data with other devices that may be connected to data processing system 1700. For example, input/output unit 1712 may provide a connection for user input through a keyboard, a mouse, and/or some other suitable input device. Further, input/output unit 1712 may send output to a printer. Display 1714 provides a mechanism to display information to a user.

Instructions for the operating system, applications, and/or programs may be located in storage devices 1716, which are in communication with processor unit 1704 through communications framework 1702. The processes of the different embodiments may be performed by processor unit 1704 using computer-implemented instructions, which may be located in a memory, such as memory 1706.

These instructions are referred to as program code, computer usable program code, or computer readable program code that may be read and executed by a processor in processor unit 1704. The program code in the different embodiments may be embodied on different physical or computer readable storage media, such as memory 1706 or persistent storage 1708.

Program code 1718 is located in a functional form on computer readable media 1720 that is selectively removable and may be loaded onto or transferred to data processing system 1700 for execution by processor unit 1704. Program code 1718 and computer readable media 1720 form computer program product 1722 in these illustrative examples.

In one example, computer readable media 1720 may be computer readable storage media 1724 or computer readable signal media 1726. In these illustrative examples, computer readable storage media 1724 is a physical or tangible storage device used to store program code 1718 rather than a medium that propagates or transmits program code 1718.

Alternatively, program code 1718 may be transferred to data processing system 1700 using computer readable signal media 1726. Computer readable signal media 1726 may be, for example, a propagated data signal containing program code 1718. For example, computer readable signal media 1726 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 1700 are not meant to provide architectural limitations to the manner in which different embodiments may be implemented. The different illustrative embodiments may be implemented in a data processing system including components in addition to and/or in place of those illustrated for data processing system 1700. Other components shown in FIG. 17 can be varied from the illustrative examples shown. The different embodiments may be implemented using any hardware device or system capable of running program code 1718.

Figure 18:
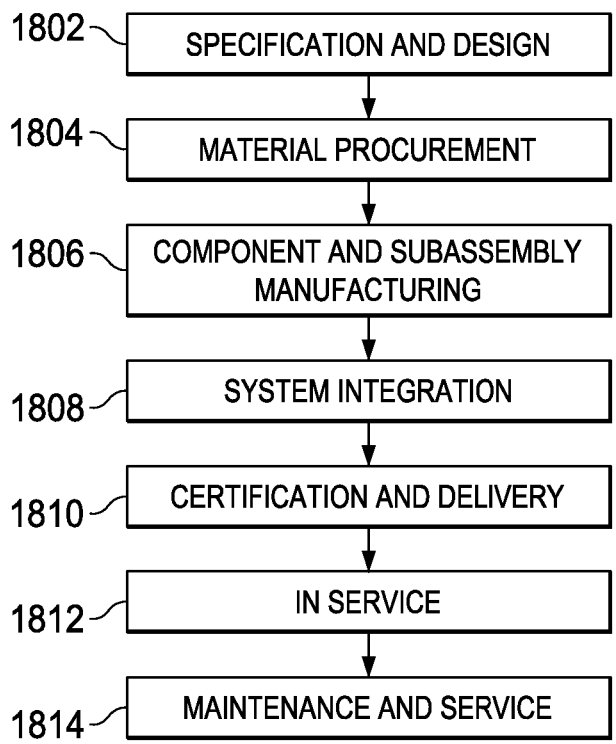
FIG. 18 is an illustration of an aircraft manufacturing and service method in the form of a block diagram in accordance with an illustrative embodiment.
Figure 19:
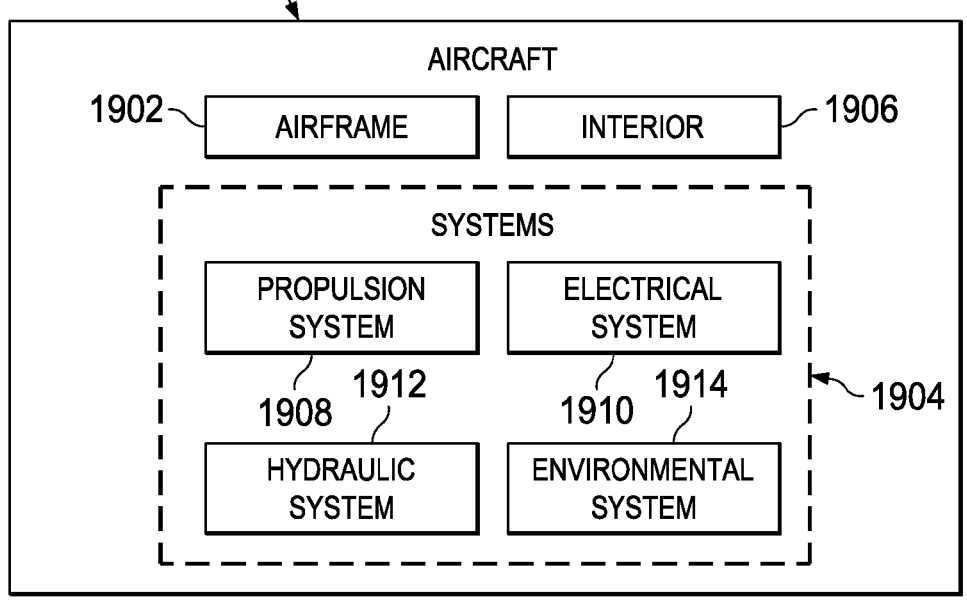
FIG. 19 is an illustration of an aircraft in the form of a block diagram in which an illustrative embodiment may be implemented.

Illustrative embodiments of the disclosure may be described in the context of aircraft manufacturing and service method 1800 as shown in FIG. 18 and aircraft 1900 as shown in FIG. 19. Turning first to FIG. 18, an illustration of an aircraft manufacturing and service method is depicted in the form of a block diagram in accordance with an illustrative embodiment. During pre-production, aircraft manufacturing and service method 1800 may include specification and design 1802 of aircraft 1900 in FIG. 19 and material procurement 1804.

During production, component and subassembly manufacturing 1806 and system integration 1808 of aircraft 1900 in FIG. 19 takes place. Thereafter, aircraft 1900 in FIG. 19 may go through certification and delivery 1810 in order to be placed in service 1812. While in service 1812 by a customer, aircraft 1900 in FIG. 19 is scheduled for routine maintenance and service 1814, which may include modification, reconfiguration, refurbishment, and other maintenance or service.

Each of the processes of aircraft manufacturing and service method 1800 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 19, an illustration of an aircraft is depicted in the form of a block diagram in which an illustrative embodiment may be implemented. In this example, aircraft 1900 is produced by aircraft manufacturing and service method 1800 in FIG. 18 and may include airframe 1902 with systems 1904 and interior 1906. Examples of systems 1904 include one or more of propulsion system 1908, electrical system 1910, hydraulic system 1912, and environmental system 1914. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1800 in FIG. 18. For example, one or more illustrative embodiments may be implemented during system integration 1808. The different illustrative examples may be implemented to identify information to perform tasks to assemble parts on aircraft 1900.

In particular, the visual query of aircraft may be used to identify locations where tasks for shop order instances are to be performed or where tasks have been performed. Additionally, an illustrative embodiment also may be implemented during maintenance and service 1814. For example, information about the aircraft may be visually queried and viewed by an operator to perform tasks to assemble parts for maintenance, upgrades, refurbishment, and other operations during maintenance and service 1814 may be identified using an illustrative embodiment.

Figure 20:
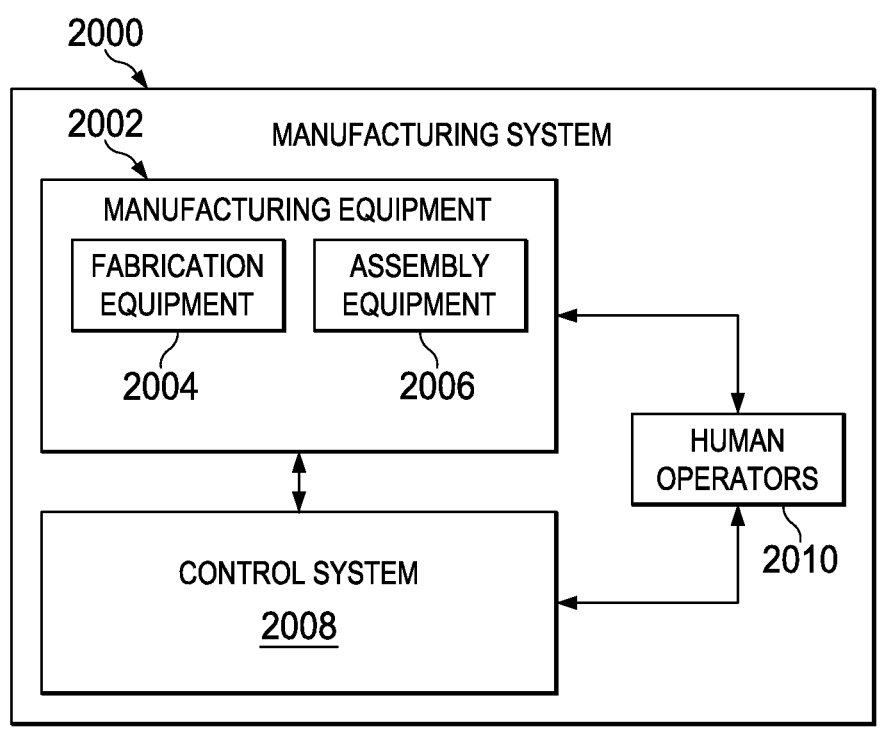
FIG. 20 is an illustration of a manufacturing system in the form of a block diagram in accordance with an illustrative embodiment.

Turning now to FIG. 20, an illustration of a block diagram of a manufacturing system is depicted in the form of a block diagram in accordance with an illustrative embodiment. Manufacturing system 2000 is a physical hardware system and is configured to manufacture products, such as aircraft 1900 in FIG. 19.

As depicted, manufacturing system 2000 includes manufacturing equipment 2002. Manufacturing equipment 2002 includes at least one of fabrication equipment 2004 or assembly equipment 2006.

Fabrication equipment 2004 is equipment that may be used to fabricate components for parts used to form aircraft 1900. For example, fabrication equipment 2004 may include machines and tools. These machines and tools may be at least one of a drill, a hydraulic press, a furnace, a mold, a composite tape laying machine, a vacuum system, a lathe, or other suitable types of equipment. Fabrication equipment 2004 may be used to fabricate metal parts, composite parts, semiconductors, circuits, fasteners, ribs, skin panels, spars, antennas, pharynx, and other suitable types of parts.

Assembly equipment 2006 is equipment used to assemble parts to form aircraft 1900. In particular, assembly equipment 2006 may be used to assemble components and parts to form aircraft 1900. Assembly equipment 2006 also may include machines and tools. These machines and tools may be at least one of a robotic arm, a crawler, a faster installation system, a rail-based drilling system, or a robot. Assembly equipment 2006 may be used to assemble parts such as seats, horizontal stabilizers, wings, engines, engine housings, landing gear systems, and other parts for aircraft 1900.

Manufacturing system 2000 also includes control system 2008. Control system 2008 is a hardware system and may also include software or other types of components. Control system 2008 is configured to control the operation of manufacturing equipment 2002. Control system 2008 may be implemented using hardware. The hardware may include computers, circuits, networks, and other types of equipment. Control system 2008 may take the form of direct control of manufacturing equipment 2002. For example, robots, computer-controlled machines, and other equipment may be controlled by control system 2008. In other illustrative examples, control system 2008 may manage operations performed by human operators 2010 in manufacturing aircraft 1900.

In these illustrative examples, object manager 124 in FIG. 1 may be implemented in control system 2000 to manage the manufacturing of aircraft 1900 in FIG. 19. As depicted, object manager 124 may generate information for operating manufacturing equipment to manufacture the aircraft.

For example, displaying a condition of assembly for an aircraft may be useful in managing the manufacture of aircraft 1900. In particular, the manufacture of aircraft 1900 may be managed using sections of aircraft displayed with the parts present in the aircraft for the state selected in a graphical user interface on a display device. In the different illustrative examples, the state may be a condition of assembly. This condition assembly may be used by different operators in human operators 2010 to manufacture aircraft 1900. For example, human operators 2010 may identify locations where assembly of parts should occur. Also, human operators 2010 also may identify whether the particular parts have been installed when the condition of assembly is an actual condition of assembly for aircraft 1900.

In the different illustrative examples, human operators 2010 may operate or interact with at least one of manufacturing equipment 2002 or control system 2008. This interaction may be performed to manufacture aircraft 1900.

Of course, manufacturing system 2000 may be configured to manufacture other products. Although manufacturing system 2000 has been described with respect to manufacturing in the aerospace industry, manufacturing system 2000 may be configured to manufacture products for other industries. For example, manufacturing system 2000 may be configured to manufacture products for the automotive industry as well as any other suitable industries.

In this manner, operators may visualize information about an aircraft using a graphical user interface. This visualization may be performed on the shop floor by operators who may not have experience and training with computer-aided design software. This visual query allows an operator to visually look at an aircraft or other object.

The visualization may be performed without operators having to know coordinates for locations in the aircraft. In these illustrative examples, the graphical user interface displays graphical representations of the aircraft that allows the operators to view different portions of the aircraft without using coordinates to traverse the views of the aircraft.

Further, with an ability to visualize different conditions of assembly for aircraft 1900, the management of operations performed by manufacturing system 2000 may occur in a manner that reduces the time to manufacture aircraft 1900, increases the efficiency in manufacturing aircraft 1900, increases efficiency in assigning shop order instances for manufacturing aircraft 1900, and other suitable goals.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of identifying a condition of assembly, the method comprising:
    identifying a model for an aircraft;
    identifying and selecting a state from states of assembly for the aircraft, wherein the states of assembly for the aircraft are based on a physical location of the aircraft within a manufacturing facility;
    identifying parts present in the aircraft for the state selected from the aircraft;
    displaying sections of the aircraft with the parts present in the aircraft for the state selected in a graphical user interface on a display device;
    detecting a selection of a section from the sections displayed in the graphical user interface;
    identifying a volume in the model corresponding to the section selected from the sections displayed in the graphical user interface;
    identifying parts present in the volume;
    displaying the section in the graphical user interface using the volume identified in the model with the parts present in the section selected with the state identified; and
    generate information for operating manufacturing equipment within the manufacturing facility to manufacture the aircraft using sections of the aircraft displayed with the parts present in the aircraft for the state selected in the graphical user interface on the display device.

2. The method of claim 1, wherein the sections correspond to sections as manufactured for assembly of the aircraft and wherein the sections are selectable.

3. The method of claim 1, wherein the step of displaying the section in the graphical user interface using the volume identified in the model with the parts present in the volume for the state for the section selected comprises:
    hiding a first group of parts in the parts in the volume that are absent from the section of the aircraft in the state selected; and
    displaying a second group of parts that are not hidden in the parts in the volume to display the section selected in the graphical user interface.

4. The method of claim 3 further comprising:
    identifying the parts present in the aircraft in a completed state;
    identifying the parts present in the aircraft in the state selected to form the second group of parts; and
    subtracting the second group of parts from the parts present in the aircraft in the completed state to identify the first group of parts.

5. The method of claim 1, wherein the condition of assembly is identified from the position of the aircraft from a plurality of positions for the aircraft.

6. A method of identifying a condition of assembly, the method comprising:
    identifying a model for an object;
    identifying and selecting a state from states of assembly for the object, wherein the states of assembly for the object are based on a physical location of the object within a manufacturing facility;
    identifying part present in an aircraft for the state selected for the object; and
    displaying the parts present in the aircraft for the state selected in a graphical user interface on a display device;
    displaying sections of the aircraft with the parts present in the aircraft for the state selected in the graphical user interface on the display device;
    detecting a selection of a section from the sections displayed in the graphical user interface;
    identifying a volume in the model corresponding to the section selected from the sections displayed in the graphical user interface;
    identifying parts present in the volume;
    displaying the section in the graphical user interface using the volume identified in the model with the parts present in the section selected with the state identified; and
    generate information for operating manufacturing equipment within the manufacturing facility to manufacture the aircraft using sections of the aircraft displayed with the parts present in the aircraft for the state selected in the graphical user interface on the display device.

7. The method of claim 6, wherein the step of displaying the section in the graphical user interface using the volume identified in the model with the parts present in the volume for the state for the section selected comprises:
    hiding a first group of parts in the parts in the volume that are absent from the section of the aircraft in the state selected; and
    displaying a second group of parts that are not hidden in the parts in the volume to display the section in the graphical user interface.

8. The method of claim 7 further comprising:
    identifying the parts present in the aircraft in a completed state;
    identifying the parts present in the aircraft in the state selected to form the second group of parts; and subtracting the second group of parts from the parts present in the aircraft in the completed state to identify the first group of parts.

9. An apparatus comprising:
   a processor;
   an object manager, running on the processor, configured to:
   identify a model for an aircraft;
   identify and select a state from a plurality of states of assembly for the aircraft, wherein the states of assembly for the aircraft are based on a physical location of the aircraft within a manufacturing facility;
   identify parts presents in the aircraft for the state selected for the aircraft;
   display sections of the aircraft with the parts present in the aircraft for the state selected;
   detect a selection of a section from the sections displayed in a graphical user interface;
   identify a volume in the model corresponding to the section selected from the sections displayed in the graphical user interface;
   identify parts present in the volume;
   display the section in the graphical user interface using the volume identified in the model with the parts present in the section selected with the state identified; and
   generate information for operating manufacturing equipment within the manufacturing facility to manufacture the aircraft using sections of the aircraft displayed with the parts present in the aircraft for the state selected in the graphical user interface on the display device.

10. The apparatus of claim 9, wherein the sections correspond to sections as manufactured for assembly of the aircraft and wherein the sections are selectable.

11. The apparatus of claim 9, wherein in being configured to display the section in the graphical user interface using the volume identified in the model with the parts present in the volume for the state for the section selected, the object manager is configured to hide a first group of parts in the parts in the parts in the volume that are absent from the section of the aircraft in the state selected and display a second group of parts that are not hidden in the parts in the volume to display the section selected in the graphical user interface.

12. The apparatus of claim 11, wherein the object manager is further configured to identify the parts present in the aircraft in a completed state; identify the parts present in the aircraft in the state selected to form the second group of parts; and subtract the second group of parts from the parts present in the aircraft in the completed state to identify the first group of parts.

13. The apparatus of claim 9, wherein the state is a condition of assembly identified from the position of the aircraft from a plurality of positions for the aircraft.

14. An aircraft manufacturing system comprising:
   a processor;
   a control system configured to control operation of manufacturing equipment; and
   an object manager, running on the processor, in the control system, wherein the object manager is configured to:
   identify a model for the aircraft;
   identify and select a state from a plurality of states of assembly for the aircraft, wherein the states of assembly for the aircraft are based on a physical location of the aircraft within a manufacturing facility;
   identify parts present in the aircraft for the state selected for the aircraft;
   display sections of the aircraft with the parts present in the aircraft for the state selected;
   detect a selection of a section from the sections displayed in a graphical user interface;
   identify a volume in the model corresponding to the section selected from the sections displayed in the graphical user interface;
   identify parts present in the volume;
   display the section in the graphical user interface using the volume identified in the model with the parts present in the section selected with the state identified; and
   generate information for operating the manufacturing equipment within the manufacturing facility to manufacture the aircraft using sections of the aircraft displayed with the parts present in the aircraft for the state selected in the graphical user interface on the display device.

15. The aircraft manufacturing system of claim 14, wherein the manufacturing equipment comprises at least one of fabrication equipment and assembly equipment.

16. The aircraft manufacturing system of claim 14, wherein the sections correspond to sections as manufactured for assembly of the aircraft and wherein the sections are selectable.

* * * * *